United States Patent
Sowlati

(10) Patent No.: US 7,567,122 B2
(45) Date of Patent: Jul. 28, 2009

(54) VARIABLE GAIN AMPLIFIERS SYSTEMS AND METHODS

(75) Inventor: Tirdad Sowlati, Irvine, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

(21) Appl. No.: 11/346,040

(22) Filed: Feb. 2, 2006

(65) Prior Publication Data
US 2006/0125562 A1    Jun. 15, 2006

Related U.S. Application Data

(63) Continuation of application No. 10/632,032, filed on Jul. 31, 2003, now Pat. No. 7,084,704.

(51) Int. Cl.
*H03F 3/14* (2006.01)

(52) U.S. Cl. .................. 330/84; 330/144; 330/145; 330/307; 333/81 R

(58) Field of Classification Search .............. 330/144, 330/145, 2, 84, 307; 333/81 R
See application file for complete search history.

(56) References Cited

U.S. PATENT DOCUMENTS

| 4,344,044 | A | 8/1982 | Harford ..................... 330/254 |
| 5,384,501 | A | 1/1995 | Koyama et al. ............. 327/336 |
| 6,084,471 | A | 7/2000 | Ruth, Jr. et al. ............ 330/254 |
| 6,504,441 | B1 * | 1/2003 | Eker ......................... 331/136 |
| 6,570,447 | B2 | 5/2003 | Cyrusian et al. ............ 330/254 |
| 2002/0175758 | A1 | 11/2002 | Cyrusian et al. | |

FOREIGN PATENT DOCUMENTS

JP      10256856      9/1998

OTHER PUBLICATIONS

Farbod Behbahani et al., "Adaptive Analog IF Signal Processor for a Wide-Band CMOS Wireless Receiver", IEEE Journal of Solid-State Circuits, Aug. 2001, vol. 36, No. 8.

* cited by examiner

*Primary Examiner*—Michael B Shingleton

(57) ABSTRACT

A system for controlling gain in a polar loop is disclosed. Embodiments of the invention provide for a substantially constant gain tolerant of changes in supply voltage, ambient temperature, and/or manufacturing process.

20 Claims, 18 Drawing Sheets

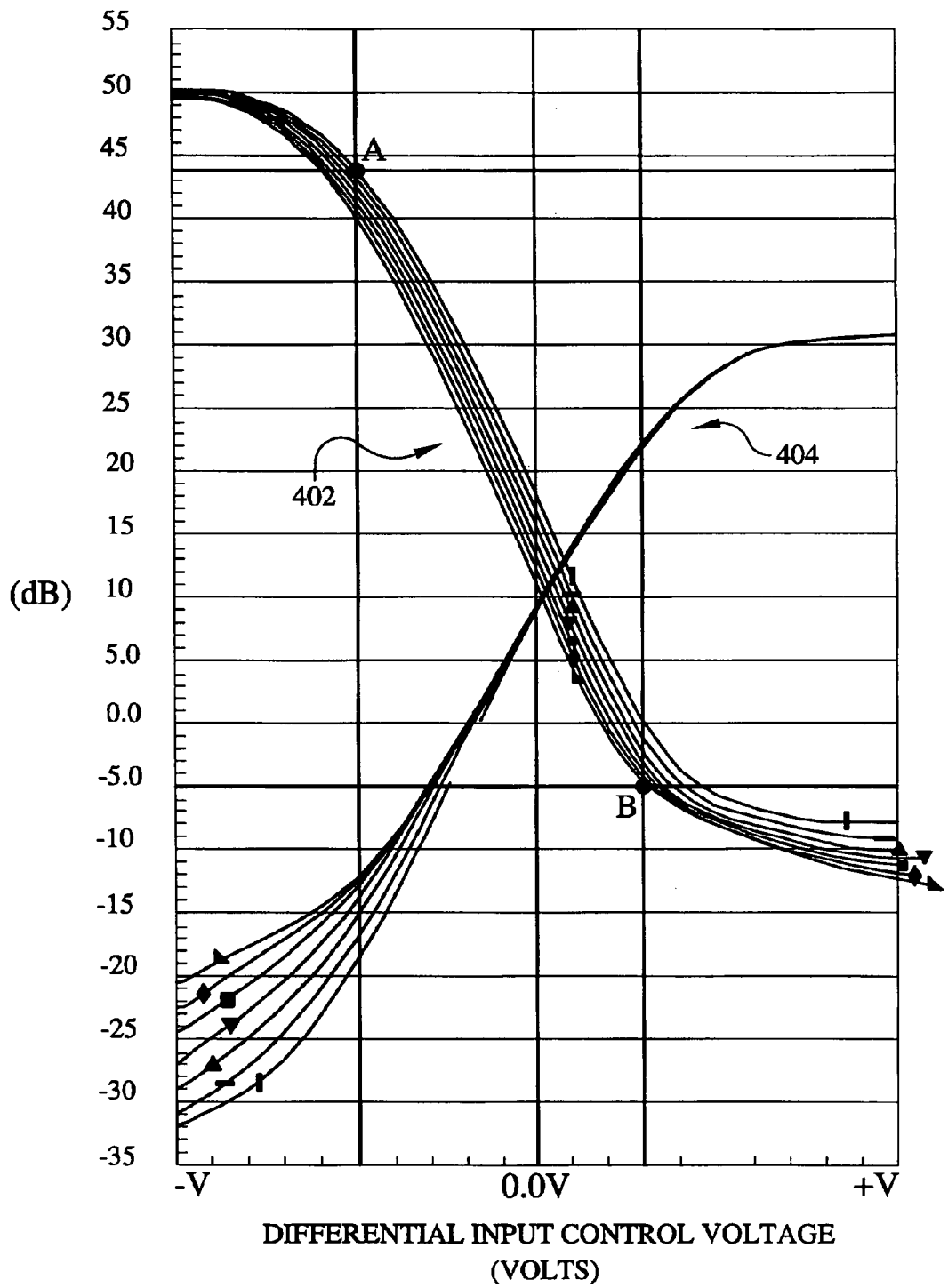

VARIABLE GAIN AMPLIFIERS SYSTEMS AND METHODS

CROSS-REFERENCE TO RELATED APPLICATION

This application is a continuation of U.S. utility application entitled, "VARIABLE GAIN AMPLIFIER SYSTEM," having Ser. No. 10/632,032, filed Jul. 31, 2003 now U.S. Pat. No. 7,084,704, which is entirely incorporated herein by reference.

BACKGROUND OF THE INVENTION

1. Field of the Invention

This invention relates generally to a transmitter architecture. More particularly, the invention relates to variable gain amplifier systems and methods.

2. Related Art

A variable gain amplifier (VGA) is a device having a control input that can vary the gain of the device. VGAs are employed in many handheld, telephone-like communication handsets, also referred to as portable transceivers. The VGA controls gain in portable transceivers. There is a need to have accurate control over the amount of gain provided by the VGA. This is especially true for systems that do not have automatic gain adjustment to compensate for variations in a manufacturing process, ambient temperature, and/or voltage supply, or systems that have a feedback loop with a VGA in the feedback path, such as in a polar loop transmitter architecture (e.g., a transmitting architecture that conveys both phase and amplitude information during transmission).

For feedback loops with one or more VGAs in the feedback path, there are typically one or more additional VGAs in the feedforward path. For example, there may be one or more stages of VGAs implemented at baseband (BB), and one or more VGAs implemented at an intermediate frequency (IF). The IF VGA has a gain variation in a direction opposite that of the BB VGA to attempt to maintain the loop gain relatively constant. Otherwise the system will be unstable.

Two basic approaches to VGA design, or generally, design of systems using VGAs, include signal summing-VGAs (e.g., a particular topology for a VGA that sums two different current paths with two different gains) and soft-switching degeneration (e.g., the degeneration being degeneration elements comprising parallel configured, variable resistance at the emitter terminals of an amplifier, and the soft-switching including controlling the variable resistance using control voltage circuitry that operates over a continuum range of voltage values (analog) as opposed to discrete (digital) control voltage values, both of which are discussed in the following IEEE publications that are herein incorporated by reference: "A low power low noise accurate linear-in-dB variable gain amplifier with 500 MHz bandwidth," S. Otaka, et al., IEEE J. Solid State Circuits, pp. 1942-1947, December 2000, and "Adaptive analog IF signal processor for a wide band CMOS wireless receiver," F. Behbahani et al., IEEE J. Solid State Circuits, pp. 1205-1217, August 2001.

In the first approach (i.e., in the bulletin by S. Otaka et al.), there is a trade-off between linearity and noise mainly because the degeneration does not change with gain. In the second approach, the degeneration effected by a soft-switching degeneration configuration changes with gain (e.g., for large signals, the degeneration is large, and for small signals the degeneration is small), which facilitates achieving both linearity with respect to the input signal and low noise. However, there is gain variation (e.g., gain is not constant) over supply voltage, temperature, and manufacturing process variations. Furthermore, it is difficult to match two cascaded VGAs (e.g., VGAs disposed in the same circuit loop, with or without intervening components located between each VGA) to cancel out their gain variation.

FIGS. 1A-3 are schematic and block diagrams that provide an overview of VGA systems in a polar loop transmitter architecture that highlights some of the problems experienced in conventional VGA systems. In a typical portable transceiver device, the gain of an IF VGA is adjusted to control the output power of a power amplifier (in a manner as described below), and a BB VGA is typically used to compensate for the gain changes of the IF VGA. This combination of IF VGA and BB VGA is implemented to attempt to provide constant gain (and thus feedback loop stability) and to also avoid spectral regrowth. Note that spectral regrowth is not allowed in certain standards in wireless communications.

FIG. 1A is a simplified block diagram of a partial polar loop system 100 carrying amplitude information. Although single lines are shown as connections to the various components, it would be understood to those having ordinary skill in the art that the connections can include differential inputs. Such a partial polar loop system 100 can be part of a transmitter portion of a portable transceiver. As shown, the partial polar loop system 100 includes an error amplifier 102, a BB VGA 104, a power amplifier (PA) 106, an IF mixer 108, and an IF VGA 110. The error amplifier 102 receives a voltage, $V_{ref}$, at node 112. $V_{ref}$ comprises varying amplitude information received from a modulator, such as an In-Phase-Quadrature (I/Q) modulator (not shown), and other processing components to be described below. The error amplifier 102 also receives a voltage, $V_{fb}$, over connection 122 from the IF VGA 110. The error amplifier 102 subtracts $V_{fb}$ from $V_{ref}$ and provides the resulting signal (with or without gain) to the BB VGA 104 over connection 114. The output of the BB VGA 104 is input to the PA 106 over connection 116, which generates an output $V_{out}$ at node 118. $V_{out}$ of the PA 106 can be fed back to the IF mixer 108. The IF signal output over connection 120 is input to the IF VGA 110, which outputs a signal over connection 122 back to the error amplifier 102 to close the loop.

The closed loop gain is given by:

$$V_{out}=(V_{ref}-fb)A_{err}A_{BBVGA}A_{PA}A_{mix} \qquad (1)$$

where $A_{err}$, $A_{BBVGA}$, $A_{mix}$, and $A_{PA}$ are the gains of the error amplifier 102, BB VGA 104, IF mixer 108, and the PA 106, respectively. In other words, $(V_{ref}-V_{fb})$ is amplified in the feedforward path. Further, $V_{fb}$ is the output voltage $(V_{out})$ multiplied by the gain in the feedback path (which includes the gain of the IF mixer 108, represented by $A_{mix}$, and the gain of the IF VGA 110, represented by $A_{IFVGA}$). Thus, $$V_{fb}=V_{out}A_{IFVGA}A_{mix} \qquad (2)$$

$$\frac{V_{out}}{V_{ref}} = \frac{A_{BBVGA}A_{PA}A_{err}}{1+A_{BBVGA}A_{mix}A_{PA}A_{err}A_{IFVGA}} \qquad (3)$$

Assuming the "1" is negligible in the denominator, the open loop gain, T, is approximated as:

$$T=A_{BBVGA}A_{PA}A_{mix}A_{err}A_{IFVGA} \qquad (4)$$

Since the gain of the IF VGA 110 and the BB VGA 104 are inversely proportional to one another, the open loop gain is constant versus VGA gain.

If T>>1, then the closed loop gain is reduced to:

$$\frac{V_{out}}{V_{ref}} \cong \frac{1}{A_{IFVGA}} \quad (5)$$

Therefore, if the gain in the feedforward path is large, the output ($V_{out}$) is controlled by the gain in the feedback path. The output of the PA 106 is directly related to the gain (and amplitude variation) of the IF VGA 110. For example, if the IF VGA gain is large, the PA output power is small. If the IF VGA gain is small, the PA output power will be large.

For a system to be stable, it is desirable to limit open loop gain variations. To achieve this goal, compensation for IF VGA gain changes can occur through the complementary operation of the BB VGA 104. For example, IF VGA gain increases can be complemented with BB VGA gain decreases, and vice versa.

FIGS. 1B and 1C are combination schematic and block diagrams of an IF VGA 110a and a BB VGA 104a that operates in conjunction with the IF VGA 110a. The "a" signifies one embodiment for the respective IF VGA 110 and the BB VGA 104 shown in FIG. 1A. The IF VGA 110a of FIG. 1B includes differential pair transistors 124 and 126 that receive a differential input over connection 120 (FIG. 1A) at base terminals 125 and 127, respectively. At the emitter terminal of the differential pair transistors 124 and 126 is an emitter degeneration element 128 that comprises one or more n-channel MOSFETs (or NMOS transistors) functioning as a variable resistance. Degeneration elements include a resistance at the emitter or source terminals of transistors comprising the input stage of an amplifier. The resistance can include resistance from transistors and/or resistors (collectively resistive elements). Degeneration elements often improve linearity with some reduction in gain and noise. The equivalent resistance of the NMOS transistors of the emitter degeneration element 128 are changed (varied) (via soft-switching, which uses a continuous range (0-100%) of voltage values from the control voltage circuitry to create a smooth change in gain, or discrete (0 or 100%, or digital) switching to create a "staircase" change in gain) via application of control voltage $V_{C1}$ to control terminal 132. $V_{C1}$ is coupled to a resistive network (not shown), and increased or decreased to provide staggered voltages to enable the equivalent resistance of one or more NMOS transistors to be changed. As the number of NMOS transistors is increased, the resulting equivalent resistance of the emitter degeneration element 128 is decreased, providing for a variation in gain.

The IF VGA 110a also includes a collector load 130 at the collector terminals of the differential pair transistors 124 and 126. The collector load 130 comprises one or more p-channel MOSFETs (or PMOS transistors) functioning as a variable resistance. The output of the collector load 130 is provided over connection 122 (FIG. 1A). The equivalent resistance of the PMOS transistors of the collector load 130 is also varied through the application of a control voltage $V_{C2}$ to control terminal 134. Power is supplied via a direct current (DC) power source (not shown) providing a voltage $V_{CC}$ to power terminal 136, which provides a supply voltage to the differential pair transistors 124 and 126, among other components as described below.

Referring to FIG. 1C, a BB VGA 104a operates in conjunction with the IF VGA 110a to attempt to provide stable gain control. The BB VGA 104a is structured similarly to the IF VGA 110a, with differential pair transistors 138 and 140 that receive a differential input over connection 114 (FIG. 1A) at base terminals 139 and 141, respectively, an emitter degeneration element 142 comprising one or more NMOS transistors, and a collector load 146 comprising one or more PMOS transistors. Control of the emitter degeneration element 142 is via the application of a control voltage $V_{C3}$ to control terminal 148. Control of the collector load 146 is via the application of a control voltage $V_{C4}$ to control terminal 150. Power is supplied via a DC power source (not shown) providing a voltage $V_{CC}$ to power terminal 152, among other components.

The control voltages $V_{C1}$ and $V_{C2}$ move in the same direction (e.g., if $V_{C1}$ is increasing, $V_{C2}$ is increasing). The control voltages $V_{C3}$ and $V_{C4}$ also move in the same direction, but opposite to the control voltages $V_{C1}$ and $V_{C2}$ since opposite gain response is desired to provide for stable gain control.

FIGS. 2A and 2B are combination schematic and block diagrams that illustrate another approach to configuring a VGA system comprising an IF VGA 110b and a BB VGA 104b. The "b" signifies another embodiment for the respective IF VGA 110 and the BB VGA 104 shown in FIG. 1A. The IF VGA 110b comprises differential pair transistors 224 and 226 that receive a differential input over connection 120 at base terminals 225 and 227, respectively. Resistors 254 and 256 are coupled between the power terminal 136 that receives a supply voltage $V_{CC}$ and collector terminals of each of the differential pair transistors 224 and 226. The resistors 254 and 256 comprise a collector load. The IF VGA 110b also includes an emitter degeneration element 228 comprising one or more NMOS transistors. The emitter degeneration element 228 is controlled by the application of a control voltage $V_{C1}$ to control terminal 132.

In FIG. 2B, a BB VGA 104b works in conjunction with similarly structured IF VGA 110b. The BB VGA 104b includes differential pair transistors 238 and 240 that receive an input over connection 114 (FIG. 1A) at base terminals 239 and 241, respectively, collector resistors 258 and 260 coupled to a supply voltage $V_{CC}$ via power terminal 152, and an emitter degeneration element 242 comprising one or more NMOS transistors controlled by the application of control voltage $V_{C3}$ at control terminal 148. In this example, $V_{C1}$ and $V_{C3}$ move in opposite directions (i.e., as $V_{C1}$ increases, $V_{C3}$ decreases, and vice versa).

FIG. 3 is a schematic view of the IF VGA 110a. A similar structure can be used for the BB VGA 104a (FIG. 1C). In a typical portable transceiver system, one or more stages of an IF VGA and/or a BB VGA are implemented (e.g., cascaded, providing the same or different gains) to provide a broader gain range. An input signal is applied to differential input terminals 302 and 314 over connection 120 (FIG. 1A). Input terminal 302 is connected to the base terminal 125 of differential pair transistor 124 via connection 304. Input terminal 314 is connected to base terminal 127 of a differential pair transistor 126 via connection 316. In addition to the base terminal 125, the differential pair transistor 124 includes a collector terminal 308 and an emitter terminal 312. Similarly, the differential pair transistor 126 includes a collector terminal 320 and an emitter terminal 324, in addition to the base terminal 127.

An energy source, such as a direct current (DC) power source (not shown), supplies voltage ($V_{CC}$) via power source terminal 136 to bias circuit 328, which includes a current source 329. The current source 329 of the bias circuit 328 causes current to flow through resistor 330 and resistors 332 and 334 via current source transistors 319 and 321 (which mirror the current from current source 329) to bias the base terminals 125 and 127. The base terminals 125 and 127, and the current source transistors 319 and 321 of the bias circuit 328 connected to the emitter terminals 312 and 324, are at a voltage level referenced to Vcc. The current source transistors 319 and 321 cause current to flow through the differential pair transistors 124 and 126 when properly biased, enabling the voltage appearing at the base terminals 125 and 127 to follow variations in Vcc.

The DC power applied at power source terminal 136 also supplies voltage to bias circuit 336, collector resistances 338 and 340, and to collector terminals of output transistors 342 and 348 provided in an emitter-follower configuration. The output transistors 342 and 348 are connected to output terminals 346 and 350, which provide a signal over connection 122 (FIG. 1A). The bias circuit 336, shown using a PMOS current mirror configuration as one example, provides a current supply to a collector load 130. This supply of current avoids excessive voltage drops through collector resistances 338 and 340 of the collector load 130.

The collector load 130 includes one or more parallel PMOS transistors 353 that provide a variable resistance load to the collector terminals 308 and 320 of differential pair transistors 124 and 126, respectively. The collector load 130 also includes collector resistors 338 and 340 at the collector terminals 308 and 320 of differential pair transistors 124 and 126. Resistance of the collector load 130 is varied based on varying $V_{C2}$ applied at control terminal 134. $V_{C2}$ is coupled to the collector load 130 via a resistive network 354. The equivalent resistance of the collector load 130 is changed by operating the PMOS transistors 353 of the collector load 130 on and off (in either a soft-switching manner or discrete (digital) manner). For example, with all of the PMOS transistors 353 of the collector load 130 off, the resistance on the collector side of the differential pair transistors 124 and 126 is due to the collector resistors 338 and 340. Turning the PMOS transistors 353 on provides for a reduced equivalent resistance of the combined collector resistors 338 and 340 and the balance of the collector load 130.

The emitter degeneration element 128 is included at the emitter terminals 312 and 324. The emitter degeneration element comprises a resistor 360 connected in parallel with one or more NMOS transistors 359. The NMOS transistors 359 of the emitter degeneration element 128 are shown connected in series with two other resistors 361 and 363 at the source and drain terminals of each of the NMOS transistors 359. Resistors 361 and 363 reduce the effect in total resistance resulting from changes in variable resistance of the NMOS transistors 359. Similar to the PMOS transistors 353 of the collector load 130, the equivalent resistance of the NMOS transistors 359 of the emitter degeneration element 128 is varied through the coupling of $V_{C1}$, applied at control terminal 132, to the emitter degeneration element 128 via a resistive network 362. For example, when $V_{C1}$ applied to the control terminal 132 is low, all of the NMOS transistors 359 of the emitter degeneration element 128 are off, resulting in the resistance at the emitter terminals 312 and 324 being provided predominantly by the resistor 360. If $V_{C1}$ applied to the control terminal 132 is high, one or more of the NMOS transistors 359 begin to turn on, resulting in a parallel combination of the resistor 360 with the activated NMOS transistors 359 and associated resistors 361 and 363, reducing the total resistive load at the emitter terminals 312 and 324.

The control operation described above that varies the equivalent resistance of the collector load 130 and the emitter degeneration element 128 is accomplished to provide linear-in-dB gain control (e.g., voltage gain of the differential pair transistors 124 and 126 in decibels=20 log|voltage gain expressed as a ratio of voltage over voltage |dB). The gain of the IF VGA 110a is determined by the total resistive load on the collectors of the differential pair transistors 124 and 126, divided by the total resistive load on the emitters of the differential pair transistors 124 and 126. Generally, if the inherent emitter resistance of the differential pair transistors 124 and 126 is neglected, the gain of the IF VGA 110a is approximately the collector load 130 comprising the PMOS transistors 353 in parallel with the collector resistances 338 and 340, divided by the emitter degeneration element 128 (comprising the resistor 360 in parallel with the combination of NMOS transistors 359 and series resistors 361 and 363). Thus, if a gain increase is desired, the total collector resistive load is increased and/or the total emitter resistive load is decreased. To decrease the gain of the IF VGA 110a, the total collector resistive load is decreased and/or the total emitter resistive load is increased.

Although the NMOS transistors 359 of the emitter degeneration element 128 are shown in series with resistors 361 and 363, and the PMOS transistors 353 of the collector load 130 have no such combination at the source and drain terminals of each of the PMOS transistors 353, one skilled in the art would understand that a series resistance could be used with or without either PMOS transistors 353 and the NMOS transistors 359. For example, a designer may choose to include a series resistance with the PMOS transistors 353 of the collector load 130 to achieve a variable resistance with less dependence on the resistivity of the transistor itself.

One problem with the IF VGA 110a described above, alone or in combination with other VGAs (e.g., BB VGA(s), IF VGA(s)) similarly structured to the configuration of the IF VGA 110a, is that the overall gain is difficult to control when the characteristics of the circuit dynamically change as a result of changes in supply voltage, ambient temperature, and/or manufacturing process. Thus, a goal of many designers is to provide an overall gain (e.g., resulting from the IF VGA 110a and BB VGA 104a combination) that is relatively constant (e.g., within a small margin of variation).

FIGS. 4A and 4B are graphs that illustrate some of the problems with conventional VGA systems, such as the VGA system 110a depicted in FIG. 3. FIG. 4A shows simulated variations in gain due to changes in supply voltage (e.g., 2.7V to 3.3V in 0.1V increments) of a combined circuit using an IF VGA and a BB VGA similarly structured to the VGA 110a shown in FIG. 3. FIG. 4B shows the total gain variation resulting from the combination of the IF VGA and BB VGA corresponding to the graph in FIG. 4A. In FIG. 4A, the graph includes an x-axis corresponding to a differential input control voltage and a y-axis corresponding to gain in units of decibels (dB). Curves 402 starting at approximately 50 dB and ending at −10 dB correspond to gain for an IF VGA. Each curve of curves 402 of the IF VGA corresponds to changes in gain as a result of variations in power source supply voltage, as indicated by the symbols with corresponding Vcc values shown in a symbol ledger 405. The IF VGA output level decreases with increases in differential input control voltage (e.g., a voltage used to generate $V_{C1}$ and $V_{C2}$ (FIG. 1B)) and varies with variations in supply voltage, but with marked distinction for each curve due to supply variations that would be further exacerbated by changes in ambient temperature and/or manufacturing process. This can be problematic in that with decreasing supply voltage, the differential input control voltage must be decreased to maintain a constant power level output.

The curves labeled 404 show increasing gain with an increase in differential input control voltage, and correspond to changes in power source supply voltage (again, further exacerbated if the BB VGAs are subject to variations in manufacturing process and/or ambient temperature). The BB VGA curves 404 have a range of approximately 30 dB down to −30 to −35 dB over the range in differential input control voltage. One goal in the design of VGA systems is to keep the combined gain variation of the IF VGA and BB VGA within a limited range. FIG. 4B shows the simulated, combined gain variation curves 406 for the IF VGA and BB VGA used to develop the curves 402 and 404 shown in FIG. 4A. The combined gain variation curves 406 range anywhere from 31 dB down to 16 dB. Even within the desired linear operating range shown between points A and B, the variation in output power as a result of changes in supply voltage (e.g., $V_{CC}$) for a given differential input control voltage is significant.

Therefore, it would be desirable to provide a VGA system for control of a power amplifier that exhibits limited variation in gain while tolerating changes in supply voltage, ambient temperature, and/or manufacturing process.

SUMMARY OF THE INVENTION

Embodiments of the invention include variable gain amplifier (VGA) systems and methods for controlling gain in a polar loop. Embodiments of the invention provide a VGA having a substantially constant gain despite changes in supply voltage, ambient temperature, and/or manufacturing process. In one embodiment, a variable gain amplifier comprises differential pair transistors, a degeneration element coupled to the differential pair transistors and of a similar type (e.g., similar type referring to like elements, such as n-channel metal oxide semiconductor (NMOS) devices in the degenerative load and NMOS devices in the collector load) to the degeneration element, wherein the collector load is coupled to the differential pair transistors, wherein a gain of the variable gain amplifier is determined by a physical dimension ratio (e.g., length and/or width) of the collector load to the degeneration element for a differential input control voltage equal to zero.

Related methods of operation are also provided. Other systems, methods, features, and advantages of the invention will be or become apparent to one with skill in the art upon examination of the following figures and detailed description. It is intended that all such additional systems, methods, and features, and advantages be included within this description, be within the scope of the invention, and be protected by the accompanying claims.

BRIEF DESCRIPTION OF THE FIGURES

Many aspects of the invention can be better understood with reference to the following drawings. The components in the drawings are not necessarily to scale, emphasis instead being placed upon clearly illustrating the principles of the present invention. Moreover, in the drawings, like reference numerals designate corresponding parts throughout the several views.

FIG. 4A is a graphical illustration showing the relationship between gain in decibels (dB) and differential input control voltage as a result of variations in supply voltage.

DETAILED DESCRIPTION

Although described with particular reference to a portable transceiver, the variable gain amplifier (VGA) system (comprising one or more VGAs at baseband (BB) frequency, radio frequency, and/or intermediate frequency (IF)) can be implemented in any system that carries information using modulation schemes implementing phase and/or amplitude variation, and/or in systems that use a feedback control loop. The description that follows will describe several embodiments for a VGA topology that provides a substantially constant gain at a specified differential input control voltage. In addition, several embodiments are described that illustrate how two or more VGAs can be configured in a complementary manner to provide a substantially constant gain summation. For example, a polar loop architecture is described that illustrates the complementary relationship between two or more VGAs.

Figure 5:
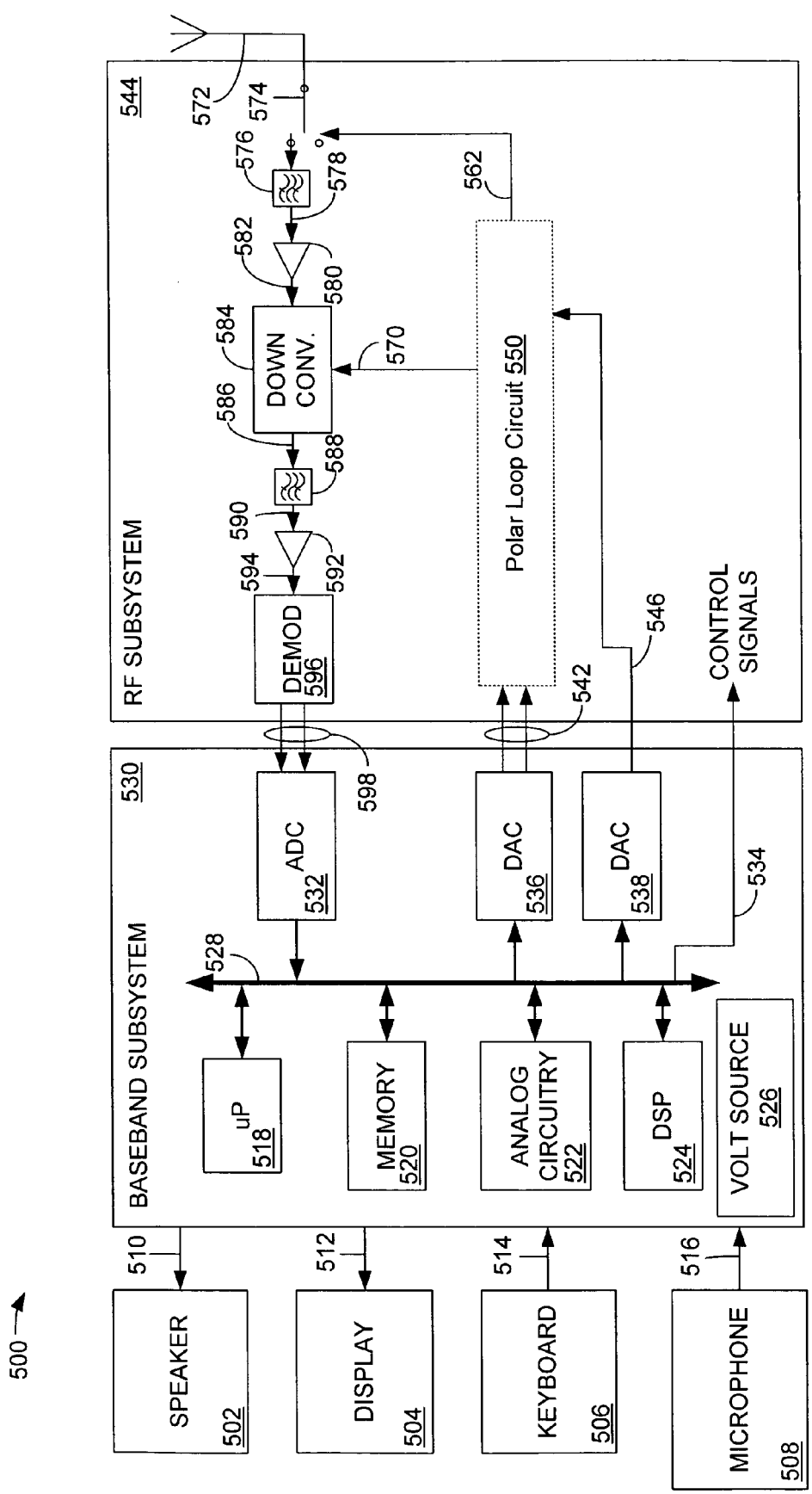
FIG. 5 is a block diagram illustrating a simplified portable transceiver.

FIG. 5 is a block diagram illustrating a simplified portable transceiver 500. Portable transceiver 500 includes speaker 502, display 504, keyboard 506, and microphone 508, all connected to baseband subsystem 530. In a particular embodiment, portable transceiver 500 can be, for example but not limited to, a portable telecommunication handset such as a mobile/cellular-type telephone. Speaker 502 and display 504 receive signals from baseband subsystem 530 via connections 510 and 512, respectively, as known to those skilled in the art. Similarly, keyboard 506 and microphone 508 supply signals to baseband subsystem 530 via connections 514 and 516, respectively. Baseband subsystem 530 includes microprocessor (μP) 518, memory 520, analog circuitry 522, and digital signal processor (DSP) 524 in communication via bus 528. Bus 528, although shown as a single bus, may be implemented using multiple busses connected as necessary among the subsystems within baseband subsystem 530. Microprocessor 518 and memory 520 provide the signal timing, processing and storage functions for portable transceiver 500. Analog circuitry 522 provides the analog processing functions for the signals within baseband subsystem 530. Baseband subsystem 530 provides control signals to radio frequency (RF) subsystem 544 via connection 534. Although shown as a single connection 534, the control signals may originate from DSP 524 and/or from microprocessor 518, and are supplied to a variety of points within RF subsystem 544. It should be noted that, for simplicity, only the basic components of portable transceiver 500 are illustrated herein.

Baseband subsystem 530 also includes analog-to-digital converter (ADC) 532 and digital-to-analog converters (DACs) 536 and 538. Although DACs 536 and 538 are illustrated as two separate devices, it is understood that a single digital-to-analog converter may be used that performs the function of DACs 536 and 538. ADC 532, DAC 536 and DAC 538 also communicate with microprocessor 518, memory 520, analog circuitry 522 and DSP 524 via bus 528. DAC 536 converts the digital communication information within baseband subsystem 530 into an analog signal for transmission to RF subsystem 544 via connection 542. DAC 538 provides gain control (e.g., single-ended or differential input control voltages) to one or more IF VGAs and BB VGAs (not shown) of the polar loop circuit 550 via connection 546. Connection 542 includes in-phase ("I") and quadrature ("Q") information that is to be input into a modulator (not shown) of the polar loop circuit 550.

RF subsystem 544 includes the polar loop circuit 550, which provides modulation, amplification and transmission functionality for the RF subsystem 544. The polar loop circuit 550 provides an amplified signal to antenna 572 via connection 562 and switch 574. Illustratively, switch 574 controls whether the amplified signal on connection 562 is transferred to antenna 572 or whether a received signal from antenna 572 is supplied to filter 576. The operation of switch 574 is controlled by a control signal from baseband subsystem 530 via connection 534. Alternatively, the switch 574 may be replaced by a filter pair (e.g., a duplexer) that allows simultaneous passage of both transmit signals and receive signals, as known in the art. A portion of the amplified transmit signal energy on connection 562 is supplied to a mixer (not shown) of the polar loop circuit 550.

A signal received by antenna 572 will be directed to receive filter 576. Receive filter 576 will filter the received signal and supply the filtered signal on connection 578 to low noise amplifier (LNA) 580. Receive filter 576 is a band pass filter, which passes all channels of the particular cellular system in which the portable transceiver 500 is operating. As an example, for a 900 MHz GSM (Global System for Mobile Communication) system, receive filter 576 would pass all frequencies from 925 MHz to 960 MHz, covering all 174 contiguous channels of 200 kHz each. The purpose of this filter is to reject all frequencies outside the desired region. LNA 580 amplifies the very weak signal on connection 578 to a level at which downconverter 584 can translate the signal from the transmitted frequency to an IF frequency. Alternatively, the functionality of LNA 580 and downconverter 584 can be accomplished using other elements, such as, for example but not limited to, a low noise block downconverter (LNB).

Downconverter 584 receives a frequency reference signal, also called a "local oscillator" signal, or "LO", from a UHF VCO (not shown) of the polar loop circuit 550 via connection 570, which signal instructs the downconverter 584 as to the proper frequency to which to downconvert the signal received from LNA 580 via connection 582. The downconverted frequency is called the intermediate frequency or IF. Downconverter 584 sends the downconverted signal via connection 586 to channel filter 588, also called the "IF filter." Channel filter 588 filters the downconverted signal and supplies it via connection 590 to amplifier 592. The channel filter 588 selects the one desired channel and rejects all others. Using the GSM system as an example, only one of the 174 contiguous channels is actually to be received. After all channels are passed by receive filter 576 and downconverted in frequency by downconverter 584, only the one desired channel will appear precisely at the center frequency of channel filter 588. A synthesizer (not shown), by controlling the local oscillator frequency supplied on connection 570 to downconverter 584, determines the selected channel. Amplifier 592 amplifies the received signal and supplies the amplified signal via connection 594 to demodulator 596. Demodulator 596 recovers the transmitted analog information and supplies a signal representing this information via connection 598 to ADC 532. ADC 532 converts these analog signals to a digital signal at baseband and transfers the signal via bus 528 to DSP 524 for further processing. As an alternative, the downconverted carrier frequency (RF frequency) at connection 586 may be 0 Hz, in which case the receiver is referred to as a "direct conversion receiver." In such a case, the channel filter 588 is implemented as a low pass filter, and the demodulator 596 may be omitted.

Figure 6:
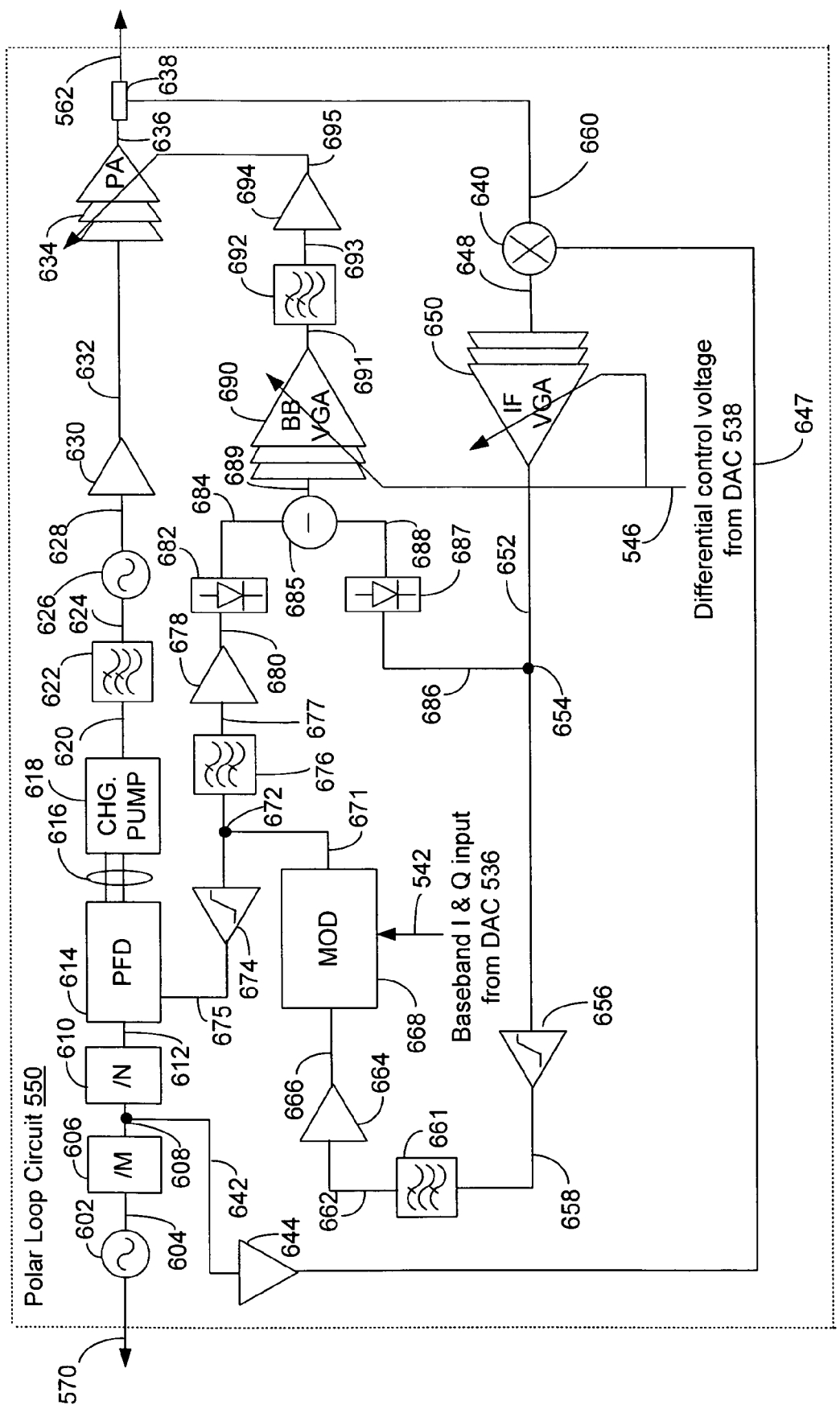
FIG. 6 is a block diagram of a transmitting section for the portable transceiver shown in FIG. 5.

FIG. 6 is a block diagram of the polar loop circuit 550 that comprises the transmitter portion for the portable transceiver 500 shown in FIG. 5. The polar loop circuit 550 is comprised of phase and amplitude information carried over a phase loop and an amplitude loop. A power amplifier in a modulation scheme that uses the polar loop circuit 550 has the amplitude and phase information applied differently to the power amplifier. The phase information is applied to an input port of the power amplifier, where it is amplified and output over an output connection. The amplitude information is used to control the gain of the power amplifier, and thus is provided to a gain control port of the power amplifier. The power amplifier thus receives an input of changing phase or frequency, but constant amplitude. The control for the power amplifier occurs via a variable amplitude signal applied to a gain control port of the power amplifier, resulting in a varying amplitude signal output for the power amplifier. The phase loop includes a path that has the following components: a UHF voltage controlled oscillator (VCO) 602, dividers 606 and 610, a phase-frequency detector (PFD) 614, a charge pump 618, a low pass filter (LPF) filter 622, a transmitter VCO 626, a buffer 630, a power amplifier 634, a coupler 638, a mixer 640, an IF variable gain amplifier (VGA) 650, limiters 656 and 674, a filter 661, an IF buffer 664, and a baseband (BB) modulator 668.

The amplitude loop includes the above components indicated for the phase loop (except for the limiter 674), filters 676 and 692, an amplifier 678, envelope detectors 682 and 687, a subtractor 685, a BB VGA 690, and a buffer 694. Note that some embodiments may have fewer or different components for the amplitude or phase loops.

Starting with the phase loop of the polar loop circuit 550, the UHF VCO 602 provides a frequency reference signal, also called a "local oscillator" signal, or "LO," on connection 604. The frequency reference signal on connection 604 is divided by a predetermined number M at divider 606. The signal at node 608 is further divided by a predetermined number N at divider 610. The signal at node 608 is also provided to the "LO" buffer 644, as explained below. The dividers 606 and 610 delineate frequency values from the UHF VCO 602 to create transmission channels for a particular user of the portable transceiver 500. The UHF VCO 602 also provides control signals to the downconverter 584 of FIG. 5 via connection 570.

The divider 610 outputs a signal to the PFD 614 over reference port connection 612. The detected signal is then supplied over connections 616 to the charge pump 618. The charge pump 618 outputs a signal over connection 620 to the low pass filter 622, where the filtered signal is applied to a transmit VCO 626 via connection 624. The transmit VCO 626 modulates the phase or frequency of the signal on connection 624. The signal output from the transmit VCO 626 over connection 628 is buffered at the buffer 630, and then the buffered signal is supplied over connection 632 to the input of the power amplifier 634.

The output of the power amplifier 634 is applied to the coupler 638 via connection 636. A portion of the phase or frequency information from the signal at the coupler 638 is fed back over connection 660 to the mixer 640. The remainder of the energy from the signal at the coupler 638 is supplied to the switch 574 (FIG. 5) via connection 562. The signal from the switch 574 is supplied to the antenna 572 (FIG. 5) for transmission.

The mixer 640 also receives a divided by M and buffered signal from the UHF VCO 602, which acts as a local oscillator for the mixer 640 to mix the RF signal at the power amplifier output down to an IF signal. That is, part of the divided by M signal at node 608 is supplied over connection 642 to the "LO" buffer 644. The buffered signal on connection 647 is then supplied to the mixer 640. The RF signal on connection 660 is mixed down to IF at the mixer 640 and supplied to the IF VGA 650 via connection 648. Connection 546 provides variable control inputs to the IF VGA 650 and the BB VGA 690. The gain of the IF VGA 650 and the BB VGA 690 can be adjusted by varying the gain control signal applied to the connection 546.

The output of the IF VGA 650 on connection 652 is applied to two different paths from node 654. Following a first path, the signal leaving node 654 is input to the limiter 656, which strips the amplitude information from the IF signal output from the IF VGA 650. The output of the limiter 656 is then supplied on connection 658 to the filter 661, which provides bandpass and low pass filtering functionality. The filtered signal output from the filter 661 is supplied over connection 662 and buffered at the IF buffer 664. The IF buffer 664 outputs the buffered signal over connection 666 to the BB modulator 668. The BB modulator 668 modulates baseband I and Q signals input to the BB modulator 668 and upconverts the modulated signals carrying the baseband information. For example, in systems conforming to EDGE (Enhanced Data Rates for GSM Evolution standards, phase and amplitude information is varied according to a π/8 differential phase-shift keying (DPSK) modulation methodology, thus placing stringent requirements for linearity in power amplification. The baseband I and Q information is provided from DAC 536 (FIG. 5) over connection 542 (FIG. 5). The modulated signal is supplied over connection 671 to node 672, where two signal paths are available. Continuing with the phase loop, the modulated signal at node 672 is supplied to the limiter 674, and then back to the PFD 614 via connection 675 to close the phase loop.

Referring now to the amplitude loop, the signal at node 672 is supplied to the bandpass filter 676 and includes both amplitude and phase information. The output of the bandpass filter 676 is supplied over connection 677 to amplifier 678. The amplifier 678 amplifies the signal on connection 677 and provides an output over connection 680 to the envelope detector 682. The envelope detector 682 detects the envelope of the amplitude information present on connection 680. The envelope detector 682 outputs a reference signal to a subtractor 685 via connection 684. Similarly, the output of the IF VGA 650 present at node 654 is supplied to the envelope detector 687 over connection 686. The envelope detectors 682 and 687 strip the phase or frequency information from the signal on connections 680 and 686, respectively, leaving only the amplitude information. The feedback signal on connection 688 carrying such amplitude information from the envelope detector 687 is input to the subtractor 685 via connection 688. Thus, the feedback signal from the output of the IF VGA 650 (the feedback path) is compared to the reference signal present at connection 684 (the reference path) to produce an error signal on connection 689. The error signal on connection 689 is input to the BB VGA 690, which amplifies the error signal on connection 689. The amplified signal on connection 691 is filtered at filter 692, and then supplied over connection 693 to buffer 694. The buffer 694 outputs the buffered signal to the power amplifier 634 via gain control connection 695, thus effecting a change in gain of the power amplifier 634.

Thus, the power amplifier 634 receives a signal via connection 632 having constant amplitude information but changing phase or frequency information due primarily to the transmitter VCO 626. However, the output of the power amplifier 634 has a variable amplitude, and that variation results from the variation present at the gain control connection 695 corresponding to the variable amplitude information of the output of the BB VGA 690. Connection 546 carries the control signals produced at DAC 538 (FIG. 5) to control the IF VGA 650 and BB VGA 690.

Figures 7A, 7B:
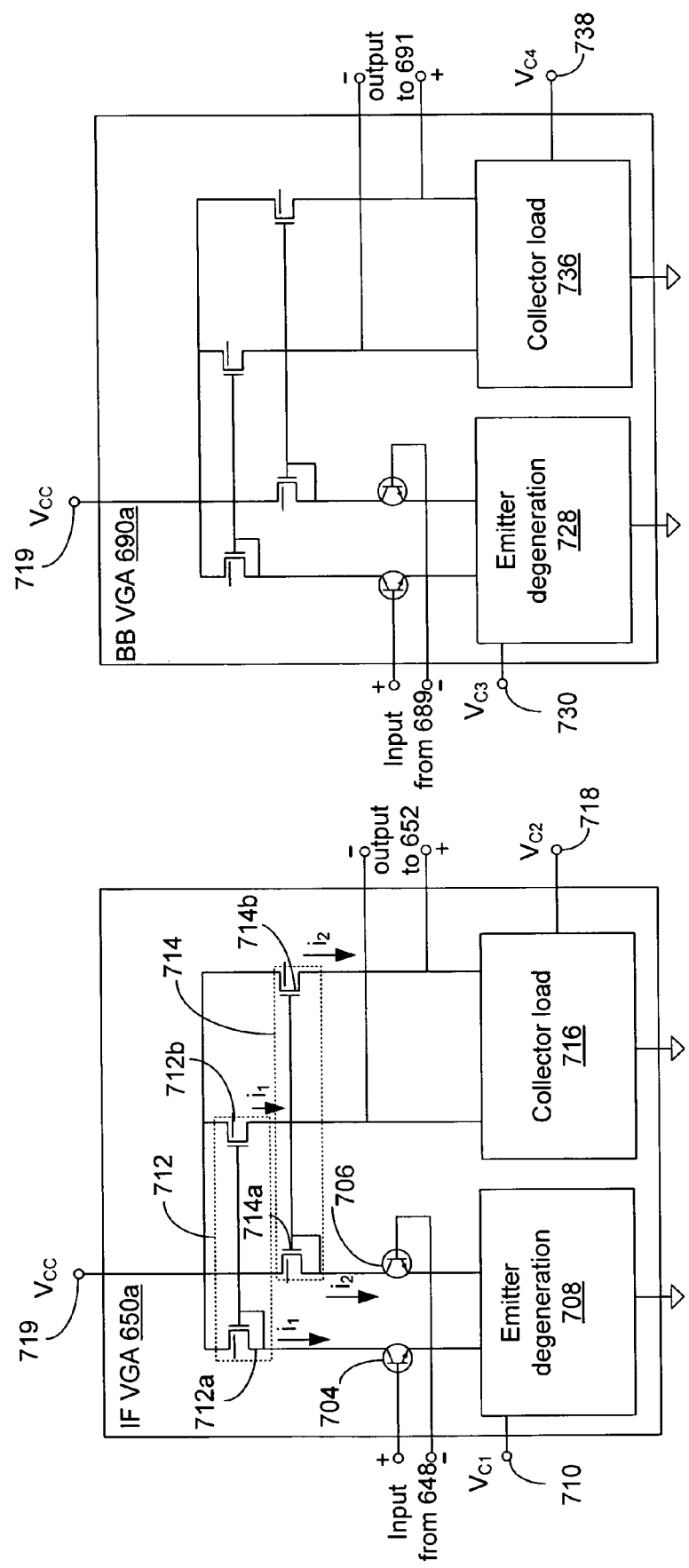
FIGS. 7A and 7B are block diagrams that illustrate one embodiment for an IF VGA and a BB VGA for the transmitting section shown in FIG. 6.

FIGS. 7A and 7B are combination schematic and block diagrams that illustrate one embodiment for an IF VGA 650a and a BB VGA 690a for the transmitting section shown in FIG. 6. In FIG. 7A, an IF VGA 650a is shown. The IF VGA 650a includes differential pair transistors 704 and 706 that receive a differential input over connection 648 (FIG. 6) at the base terminals of the differential pair transistors 704 and 706. Although shown as NPN bipolar junction transistors (BJTs), PNP BJTs can be used in other embodiments, as well as other transistors such as heterojunction bipolar transistors (HBTs), junction field-effect transistors (JFETs), and metal oxide field-effect transistors (MOSFETs). The differential pair transistors 704 and 706 include an emitter degeneration element 708 coupled to the emitter terminals of the differential pair transistors 704 and 706. The emitter degeneration element 708 is controlled by a control voltage $V_{C1}$ applied to control terminal 710. The emitter degeneration element 708 includes a first type of variable resistance, such as one or more NMOS transistors (e.g., or other resistive elements such as other three terminal devices or resistors). The IF VGA 650a also includes a current mirror 712 comprising, in one embodiment, a pair of PMOS transistors 712a and 712b. The current mirror 712 mirrors the current $i_1$ of the differential pair transistor 704 to a collector load 716. Similarly, current mirror 714 (comprising a pair of PMOS transistors 714a, 714b) mirrors the current $i_2$ of the differential pair transistor 706 to the collector load 716. In other embodiments, the function of mirroring the current can be replaced with "folding" the current (e.g., using a current source instead of the PMOS transistors), as that term is known in the art. Further, in other embodiments, a current mirror can be employed that mirrors current with respect to ground (versus Vcc as described herein). For example, PMOS transistors can be configured as the differential input transistors and the current mirrors can comprise NMOS transistors. Other variations can likewise be used. The variation in resistance of the collector load 716 is controlled by control voltage $V_{C2}$ applied at control terminal 718. The output of the collector load 716 is supplied over connection 652 (FIG. 6). A DC power source (not shown) provides supply voltage $V_{CC}$ to power terminal 719.

Figure 1A:
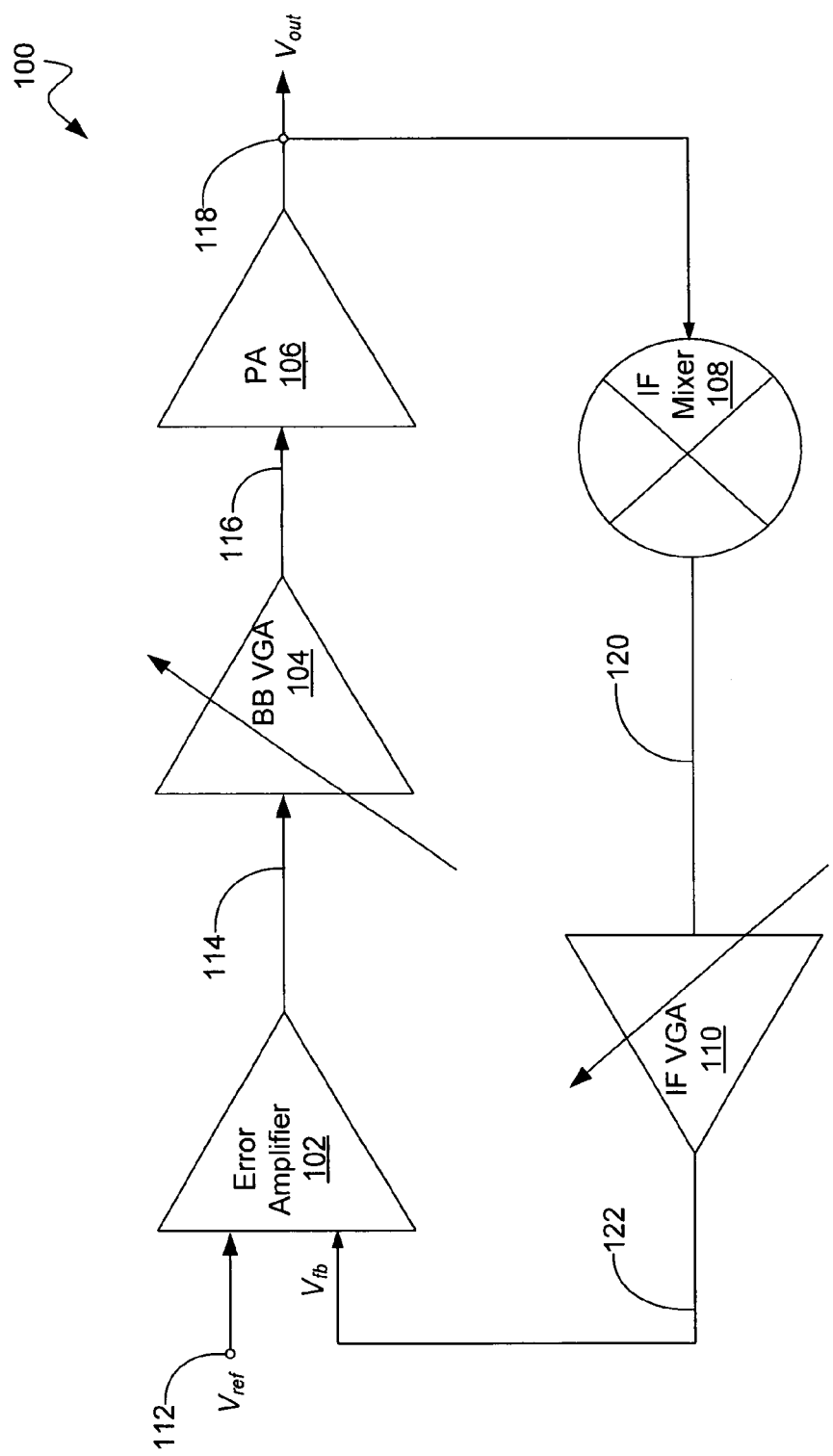
FIG. 1A is a simplified block diagram of a portion of a polar loop system carrying amplitude information.
Figures 1B, 1C:
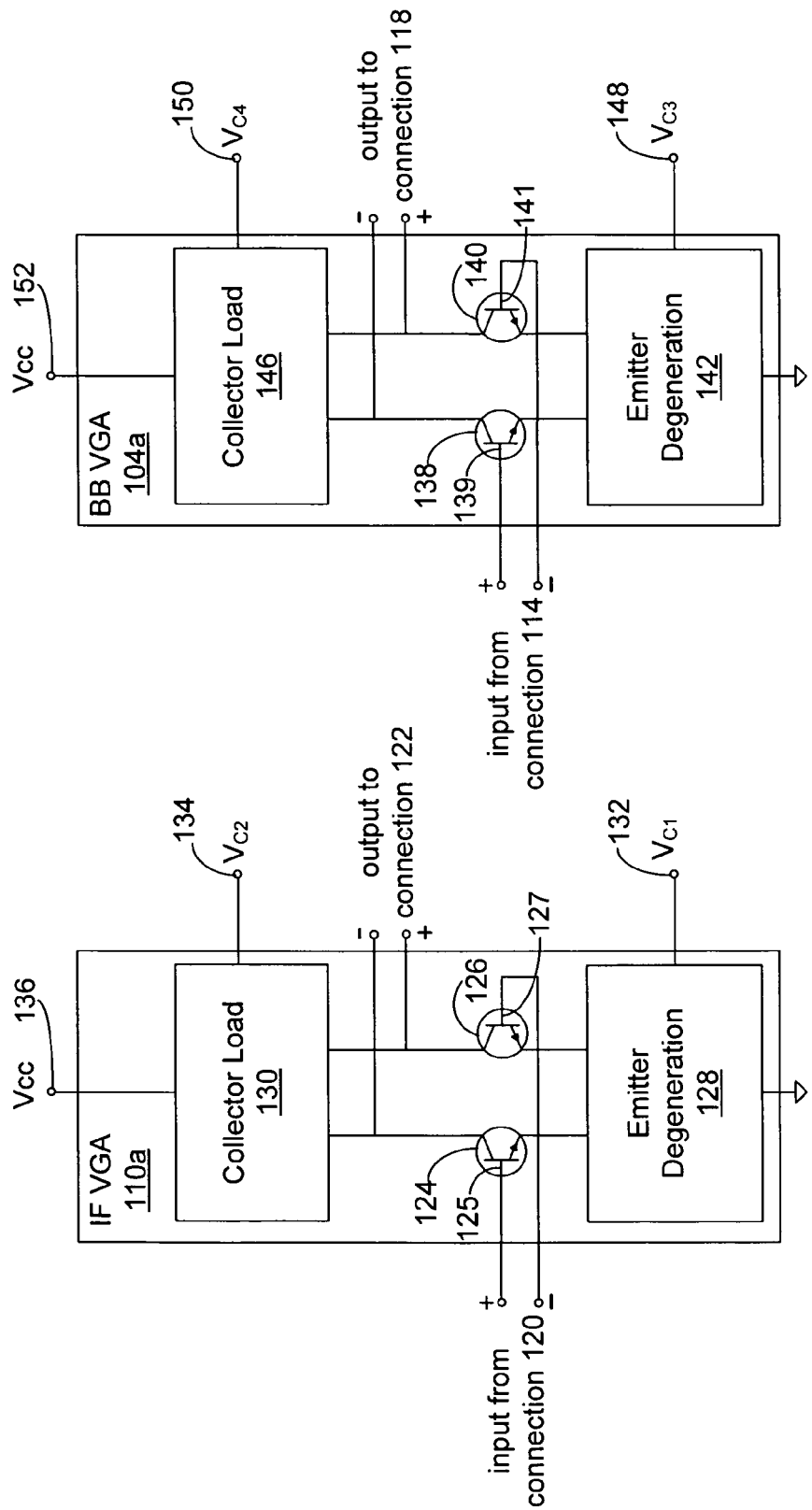
FIGS. 1B and 1C are combination schematic and block diagrams that illustrate an exemplar configuration for an intermediate frequency (IF) variable gain amplifier (VGA) and a baseband (BB) VGA.

The collector load 716 includes similar types of resistive elements as the emitter degeneration element 708 (e.g., NMOS transistors), unlike conventional systems such as those shown in FIGS. 1B and 1C. The conventional system shown in FIG. 1B, for example, provides an emitter degeneration element 128 that uses transistors of a different type (e.g., NMOS) than those used in the collector load 130 (e.g., PMOS). When circuits are subject to variations in supply voltage, ambient temperature, and/or manufacturing process, the use of different transistors (and thus different dimensions of width and/or length and/or different threshold voltages) between the collector load 130 and the emitter degeneration element 128 results in a wide variance in resistance, which translates into a wide variation in gain. The collector load 716, though using a similar type of variable resistance as the emitter degeneration element 708, can use a different sized (and thus different ohmic value) resistance. For example, the emitter degeneration element 708 can have a nominal resistance of 1 k ohms, and the collector load 716 can have a nominal resistance of 3 k ohms. As is described below, when $V_{C1}$ is substantially equal to $V_{C2}$, the gain of the IF VGA 650a is 3 (i.e., 3 k divided by 1 k). Thus, the NMOS transistors of the collector load 716 and emitter degeneration element 708 are of the same type, but with different length and/or width (e.g., the 3 k ohm resistance NMOS transistor of the collector load 716 may be 300 microns long, whereas the 1 k ohm resistance NMOS transistor of the emitter degeneration element 708 may be 100 microns long). Thus, the gain of the IF VGA 650a is determined by the ratio of the length and/or width of the resistive elements (e.g., resistors and/or transistors) of the collector load 716 divided by the length and/or width of the resistive elements (e.g., resistors and/or transistors) of the emitter degeneration element 708. When control voltages $V_{C1}$ and $V_{C2}$ are substantially similar in value (e.g., zero volts differential input control voltage), and an emitter degeneration element 708 and collector load 716 comprising of the same type of variable resistance is used, the gain of the IF VGA 650a is substantially constant despite changes in voltage supply, ambient temperature, and/or manufacturing process since the resistive elements are closely matched.

Also different from the conventional approach shown in FIGS. 1A and 1B is the fact that control voltages $V_{C1}$ and $V_{C2}$ are applied to cause them to act oppositely (i.e., when $V_{C1}$ is increasing, $V_{C2}$ is decreasing). That is, within a single stage IF VGA 650a, the control voltages $V_{C1}$ and $V_{C2}$ act in opposite directions. The architecture of the embodiments of the invention enable this opposite polarity control voltage methodology to occur.

FIG. 7B shows a block diagram of a BB VGA 690a that works in conjunction with the IF VGA 650a of FIG. 7A. As shown, the BB VGA 690a is similarly structured to the IF VGA 650a, and thus like components will not be described except as indicated below. An emitter degeneration element 728 and collector load 736 are controlled by control voltages $V_{C3}$ and $V_{C4}$ via connections to control terminals 730 and 738. Similar to the control voltage operation described for the IF VGA 650a, the control voltages $V_{C3}$ and $V_{C4}$ move in opposite directions within a single BB VGA stage. Further, to provide for stable gain control, $V_{C1}$ and $V_{C4}$ move in the same direction, whereas $V_{C2}$ moves in the same direction as $V_{C3}$.

Figure 8A:
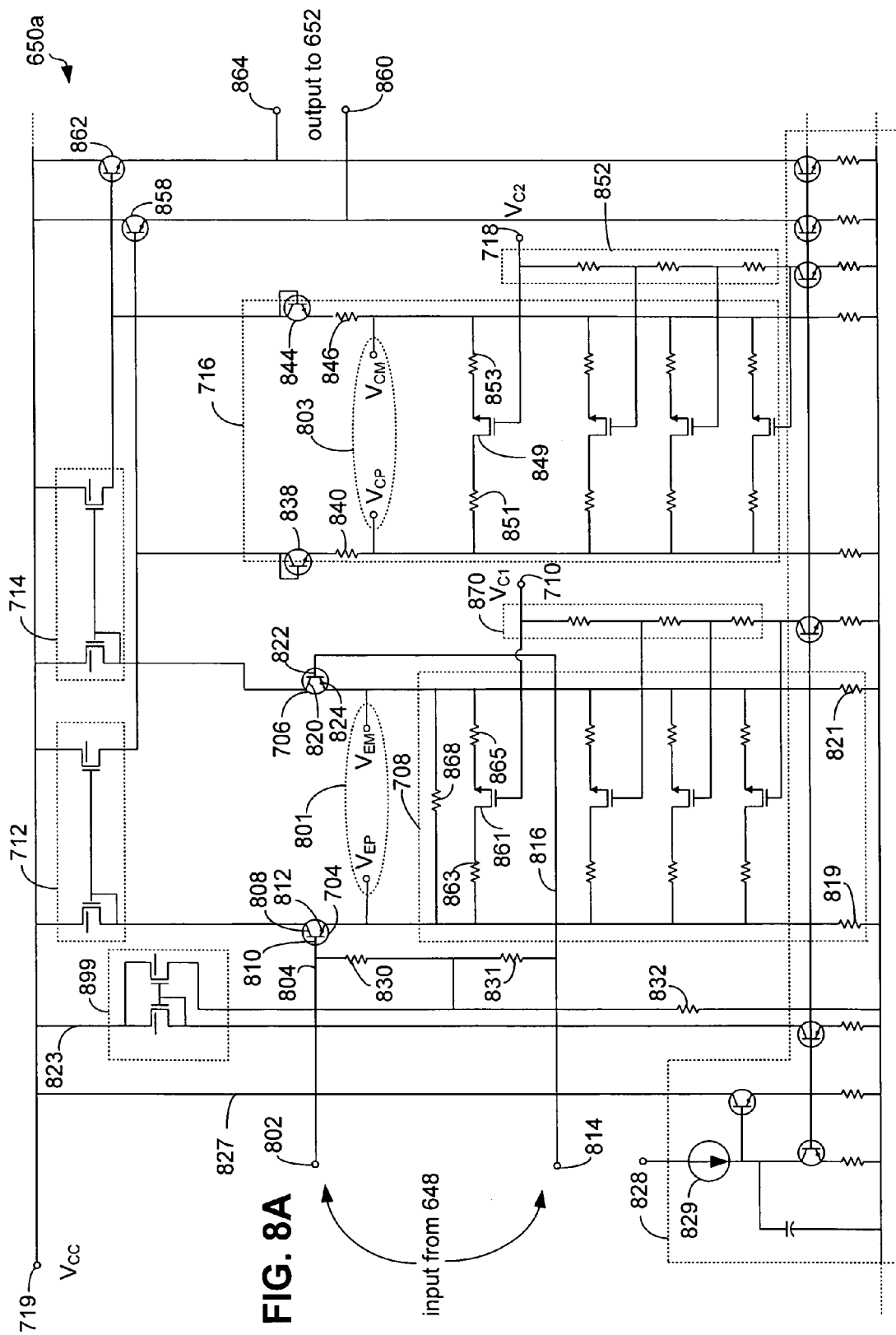
FIG. 8A is a schematic diagram of an embodiment of an IF VGA with a first biasing scheme, the IF VGA similarly structured to the IF VGA embodiment shown in FIG. 7A.

FIG. 8A is a schematic diagram of the IF VGA 650a, which can be implemented in one or more stages. An input signal carried over connection 648 (FIG. 6) is applied to differential input terminals 802 and 814. Input terminal 802 is connected to the base terminal 810 of a differential pair transistor 704 via connection 804. Input terminal 814 is connected to the base terminal 822 of a differential pair transistor 706 via connection 816. In addition to the base terminal 810, the differential pair transistor 704 includes a collector terminal 808 and an emitter terminal 812. Similarly, the differential pair transistor 706 includes a collector terminal 820 and an emitter terminal 824, in addition to the base terminal 822.

Power source terminal 719 couples voltage ($V_{CC}$) from a direct current (DC) power source (not shown) to bias circuit 828 via connection 827. Bias circuit 828 includes a current source 829 and resistors 819 and 821. Resistors 819 and 821 represent a portion of a biasing arrangement enabling the base terminals 810 and 822 to be referenced to ground. Other biasing schemes can be used, as will be described in FIG. 8B. Power source terminal 719 also couples voltage from the power source to bias circuit 899 via connection 823, and supplies DC voltage to the resistors 830 and 831 and resistor 832. Voltage is also supplied from the DC power source (applied at power source terminal 719) to current mirrors 712 and 714. The current mirrors 712 and 714 comprise PMOS transistors, as described in association with FIGS. 7A and 7B. The collector current of differential pair transistors 704 and 706 is mirrored by the PMOS transistors of the current mirrors 712 and 714 to allow the same or similar load to be used at the emitter degeneration element 708 as is used in the collector load 716. The PMOS transistors of the current mirrors 712 and 714 mirror the current of the differential pair transistors 704 and 706 to the collector load 716 through diode-connected transistors 838 and 844 and resistors 840 and 846.

The collector load 716 comprises one or more parallel-configured NMOS transistors 849. The collector load 716 also includes diode-connected transistors 838 and 844 and resistors 840 and 846. The diode-connected transistors 838 and 844 are used to match the inherent base-to-emitter resistance of the differential pair transistors 704 and 706. The NMOS transistors 849 of the collector load 716 are connected in series with two resistors 851 and 853 at the source and drain of each of the NMOS transistors 849. The collector load 716 includes resistive elements of a similar type to those used for an emitter degeneration element 708 connected to the emitter terminals 812 and 824 of the differential pair transistors 704 and 706.

The resistance of the collector load 716 is varied based on varying control voltage $V_{C2}$ applied at control terminal 718, which is coupled to the collector load 716 over a resistive network 852. The variable resistance of the collector load 716 is changed by sequentially turning on and off (e.g., using either soft-switching or discrete switching methodologies) the NMOS transistors 849 of the collector load 716.

Output transistors 858 and 862 are at the collector side of the IF VGA 650a, providing an emitter follower configuration that provides an output voltage over connection 652

(FIG. 6) at output terminals 860 and 864. Note that a differential collector voltage, $V_{CP}$ ("C" representing collector, "P" representing a positive polarity) and $V_{CM}$, ("M" representing a negative, or minus, polarity) is available at terminals 803, to be explained below.

An emitter degeneration element 708 is included at the emitter terminals 812 and 824 of the differential pair transistors 704 and 706. The emitter degeneration element 708 comprises a resistor 868 in parallel with one or more NMOS transistors 861. The emitter degeneration element 708 also includes the resistors 819 and 821, which are also coupled in parallel with resistor 868. The NMOS transistors 861 of the emitter degeneration element 708 are shown in each parallel-connected branch (e.g., parallel-connected to the emitter terminals 812 and 824) to be connected in series with two other resistors 863 and 865, as is true for the resistor-NMOS transistor-resistor arrangement of the collector load 716. Note that in other embodiments, PMOS transistors can be used for the emitter degeneration element 708 and the collector load 716. Similar to the NMOS transistors 849 of the collector load 716, the NMOS transistors 861 of the emitter degeneration element 708 are turned on and off through the coupling of $V_{C1}$ applied at a control terminal 710 to the emitter degeneration element 708 via a resistive network 870. For example, when $V_{C1}$ is low, all of the NMOS transistors 861 of the emitter degeneration element 708 are off, resulting in the resistance at the emitter terminals 812 and 824 being provided predominantly by the value of resistor 868. If $V_{C1}$ is high, one or more of the NMOS transistors 861 (depending on the threshold voltage required to turn on) are turned on, resulting in a parallel combination of the resistor 868 with the series connection of the activated NMOS transistors 861 with the resistors 863 and 865, reducing the equivalent resistance at the emitter terminals 812 and 824. Note that a differential emitter voltage $V_{EP}$ ("E" representing emitter, "P" representing a positive polarity) and $V_{EM}$, ("M" representing a negative, or minus, polarity) is available at terminals 801, to be explained below.

In one embodiment, a result of fabricating the emitter degeneration element 708 to be physically similar in type to the collector load 716 is that the gain provided by the IF VGA 650a is now dependent on the ratio of the length and/or width of the resistive elements of the collector load 716 divided by the length and/or width of the resistive elements of the emitter degeneration element 716 at a differential input control voltage equal to zero volts. This ratio dependence enables substantially constant gain operation within acceptable margins despite variations in manufacturing process, voltage supply, and/or ambient temperature. Conventional VGA systems having a combination of NMOS and PMOS devices at the emitter degeneration element and the collector load have characteristics that cause the transistors to exhibit independent behavior.

Note that NPN transistors were illustrated for the differential pair transistors 704 and 706 in association with NMOS transistors for the emitter degeneration element 708 and collector load 716 and PMOS transistors for the current mirrors 712 and 714. In other embodiments, PNP transistors can be used for the differential pair transistors 704 and 706 with PMOS transistors used for the emitter degeneration element 708 and the collector load 716 and NMOS transistors for the current mirrors 712 and 714. Further, although resistors are used in series with the source and drain terminals of the NMOS transistors of the emitter degeneration element 708 and the collector load 716, in other embodiments, each branch (e.g., each parallel current path) of the emitter degeneration element can utilize different resistive load configurations (e.g., NMOS transistor without a series resistor) as long as such alterations made in the emitter degeneration element are mirrored in the collector load.

In addition, although shown with NMOS, PMOS, and bipolar transistors, other embodiments of VGA systems can include CMOS transistors, JFETs, among other three terminal devices.

Figure 8B:
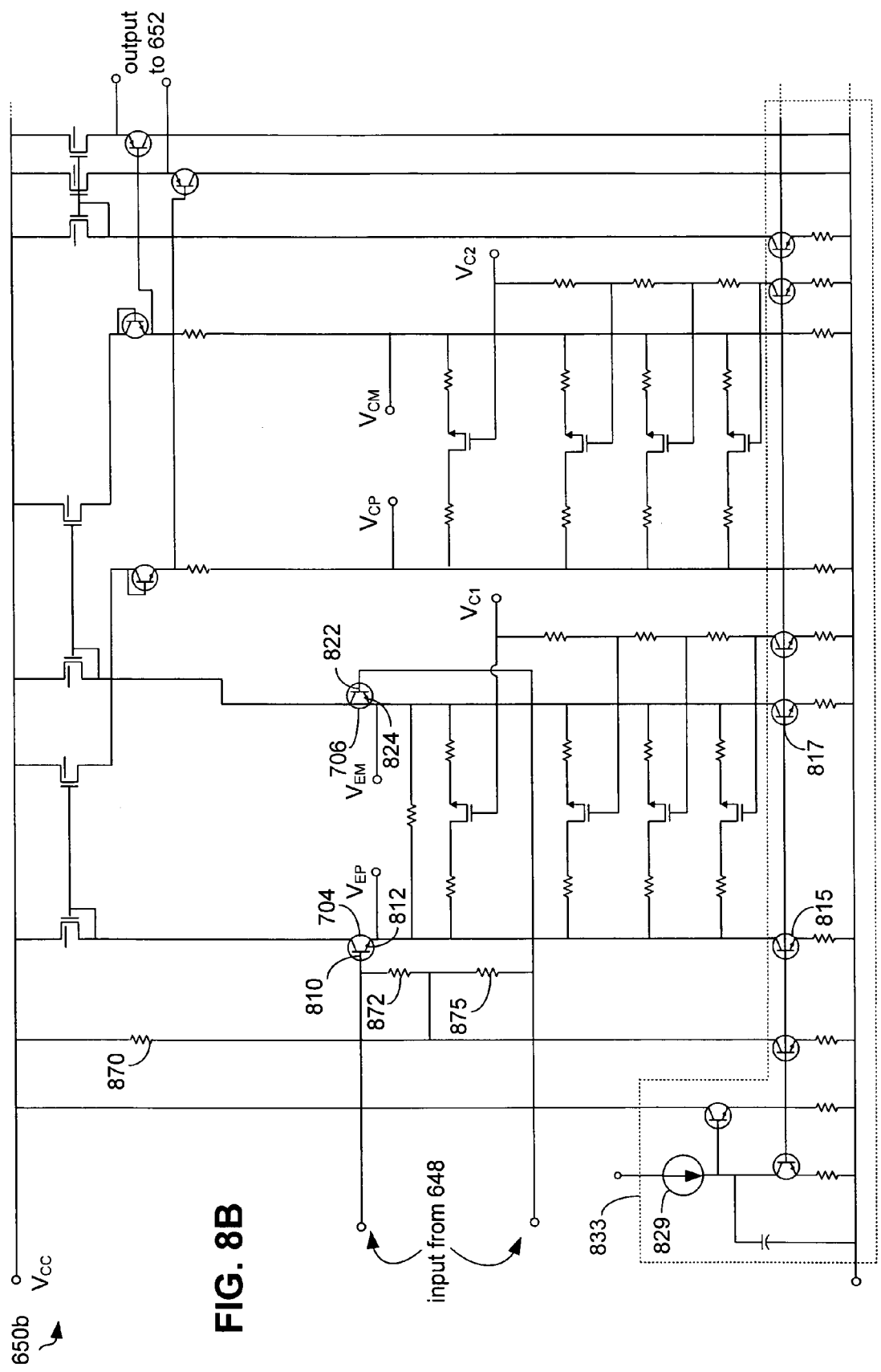
FIG. 8B is a schematic diagram of an embodiment of an IF VGA with a second biasing scheme, the IF VGA similarly structured to the IF VGA embodiment shown in FIG. 7A.

FIG. 8B is a schematic diagram of an IF VGA 650b with like-components of the IF VGA 650a, illustrating an alternative biasing arrangement for the emitter degeneration element. The current source 829 of the bias circuit 833 causes current to flow through resistor 870 and resistors 872 and 875 via current source transistors 815 and 817, which mirror the current from current source 829, to bias the base terminals 810 and 822 of the differential pair transistors 704 and 706, respectively. The base terminals 810 and 822 and the current source transistors 815 and 817 of the bias circuit 833 connected to the emitter terminals 812 and 824 are at a voltage level referenced to Vcc. The current source transistors 815 and 817 cause current to flow through the differential pair transistors 704 and 706, enabling the base terminals 810 and 822 to follow variations in Vcc. The current source transistors 815 and 817 are not included in the emitter degeneration element due in part to the high input impedance of the transistors 815 and 817.

Configurations for one or more stages of BB VGAs would be similarly structured to the IF VGAs 650a and 650b described above.

Figure 9:
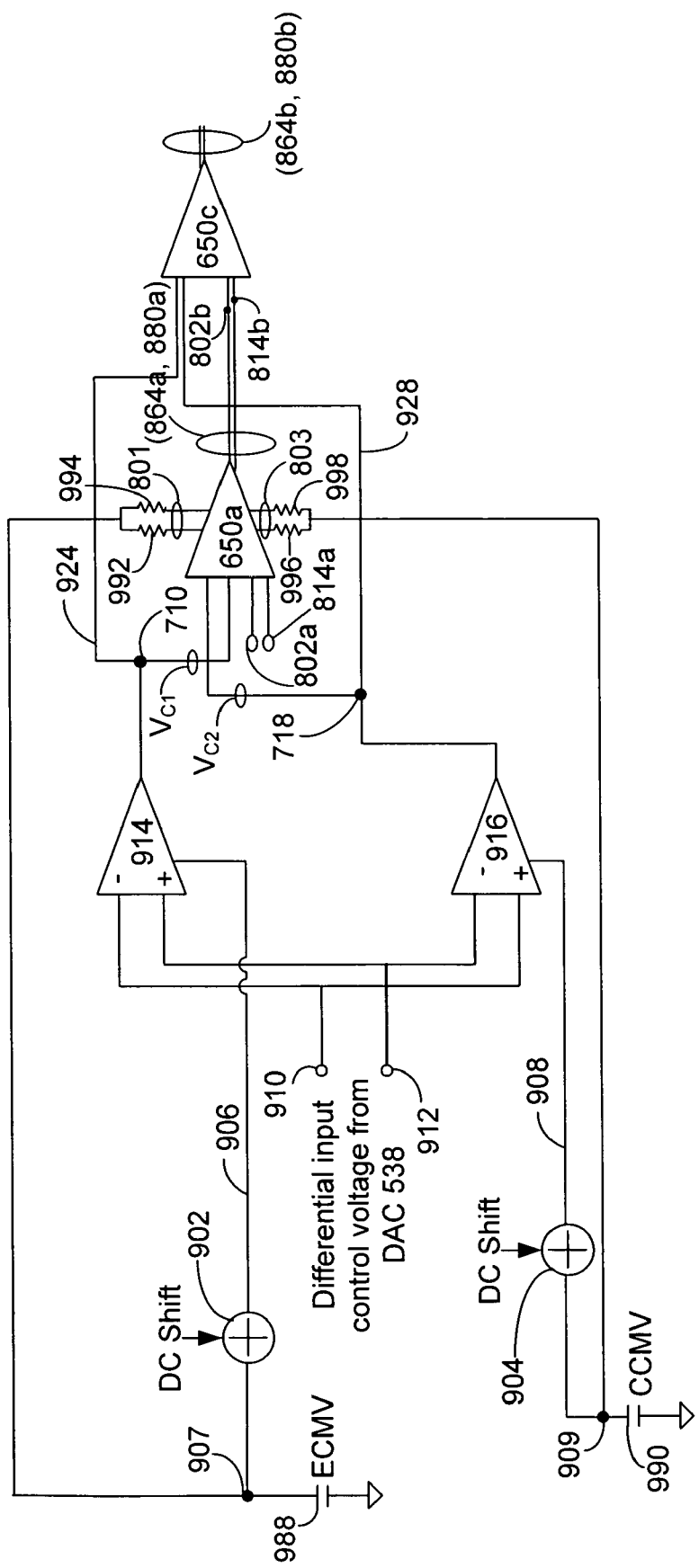
FIG. 9 is a combination schematic and block diagram illustrating an embodiment of a multi-stage IF VGA control arrangement.

Often in VGA systems a plurality of IF VGAs (and a plurality of BB VGAs) are used, depending on the desired gain. FIG. 9 is a schematic diagram illustrating an embodiment of a multi-stage IF VGA arrangement, which also similarly applies to a multi-stage BB VGA arrangement. As an example, assume two cascaded, capacitively-coupled (coupling capacitors not shown) IF VGAs 650a and 650c, where IF VGA 650c is structured similarly to the IF VGA 650a also depicted in FIG. 8A. Note that IF VGA stages are capacitively coupled, which maintain distinct biases within each stage. Multiple BB VGA stages are directly coupled, resulting in a second stage that omits the input biasing components of the second stage (e.g., resistors 870, 872, and 875 of FIG. 8B). Note that other embodiments can include an IF VGA or BB VGA structured similarly to the IF VGA 650b as shown in FIG. 8B. The IF VGAs 650a and 650c can be substantially identical in gain, or the gains can be different (in which case control circuitry for the VGAs 650a and 650c may be different) while still maintaining the same gain variation.

Summer circuits 902 and 904 receive a DC shift from locally disposed bandgap circuitry (not shown). The DC shift is selected to have a voltage value at least equal to the threshold voltage of the type of transistor device (e.g., NMOS) included in the degeneration element (e.g., degeneration element 708, FIG. 8A) and collector load (e.g., collector load 716, FIG. 8A). The selection of a DC shift value comparable to the threshold voltage provides an operating reference point for the particular VGA of interest.

Summer circuit 902 is also supplied with the emitter common mode voltage (ECMV) at terminal 907. The differential emitter voltage $V_{EP}$-$V_{EM}$ (FIG. 8A) at terminal 801 is averaged at resistors 992 and 994 and capacitor 988 to provide an ECMV at terminal 907. Summer circuit 904, which has a similar structure to the summer circuit 902, is supplied with the collector common mode voltage (CCMV) from terminal 909. The differential collector voltage $V_{CP}$-$V_{CM}$ (FIG. 8A) at terminal 803 is averaged at resistors 996 and 998 and capacitor 990 to provide a CCMV at terminal 909. The CCMV and ECMV at terminals 907 and 909 are added by summer circuits 902 and 904 to the DC shift to produce the reference voltages on connections 906 and 908.

Figure 13:
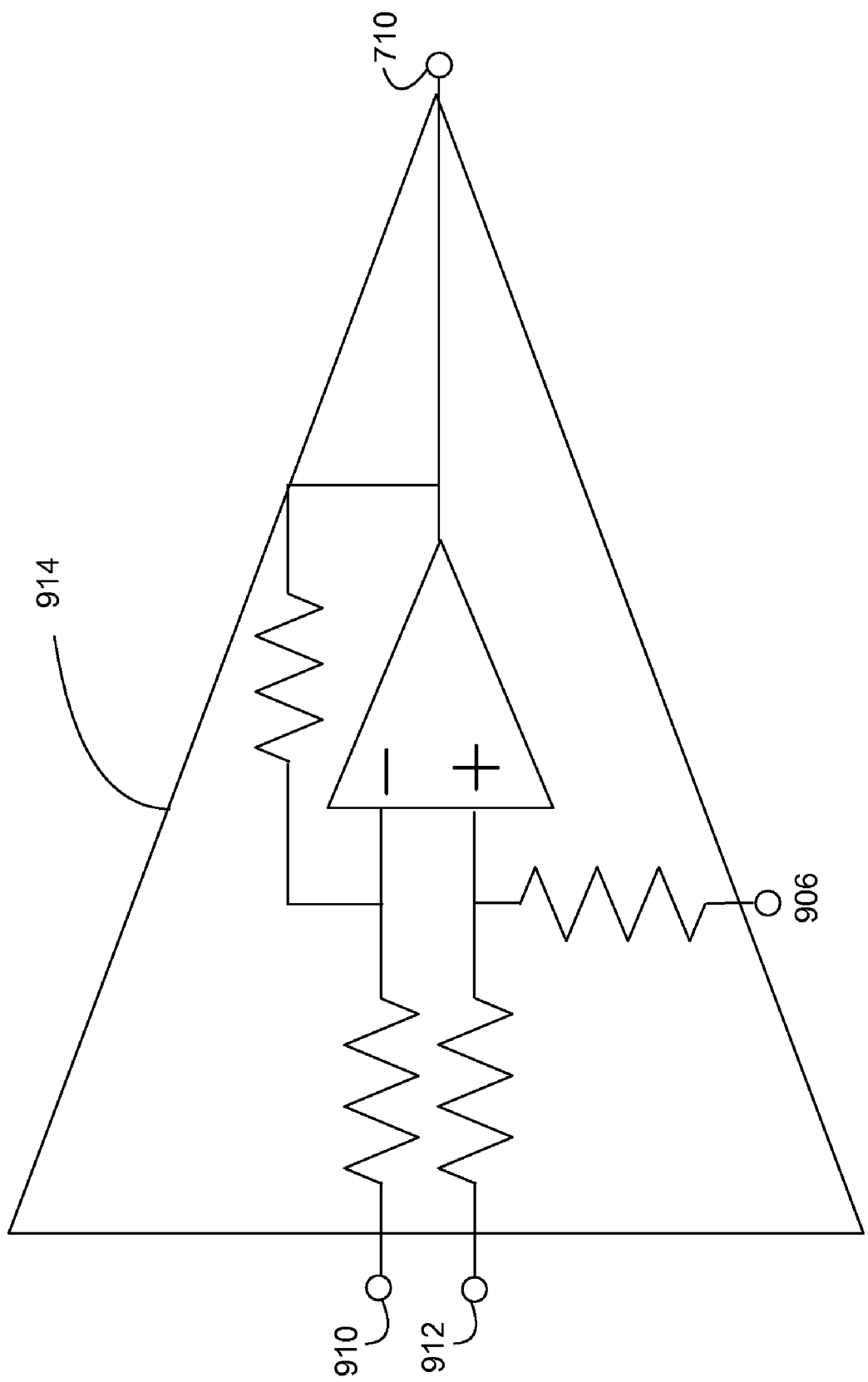
FIG. 13 is a block diagram that illustrates an example difference amplifier configuration, such as for one of the difference amplifiers shown in FIG. 9.

The differential input control voltage from a component such as the DAC 538 of the baseband subsystem 530 (FIG. 5) is applied to control terminals 910 and 912 (e.g., over connection 546 (FIG. 5)), with the result that the voltage applied at control terminal 910 is applied to the non-inverting terminal of the difference amplifier 916 and the inverting terminal of the difference amplifier 914. An example configuration of a difference amplifier, such as difference amplifier 914, is shown in FIG. 13. The differential input control voltage is used to control the gain of the IF VGA 650a. In similar fashion, the voltage applied to control terminal 912 is applied to the inverting terminal of the difference amplifier 916 and to the non-inverting terminal of the difference amplifier 914. At the difference amplifier 914, signals 912 and 906 are added together, and the signal at 910 is subtracted from the sum of the signals at 912 and 906 to create a DC voltage, $V_{C1}$, at control terminal 710. Similarly, at the difference amplifier 916, signals at connections 910 and 908 are added, and the sum has the signal at 912 subtracted to provide a DC voltage, $V_{C2}$, at control terminal 718. Thus, the control voltages $V_{C1}$ and $V_{C2}$ are DC-shifted versions of the differential input control voltage applied at control terminals 910 and 912.

The +/− and −/+ "swapping" arrangement to the difference amplifiers 914 and 916 ensures that increasing control voltages provided to the control terminal 710 are met with decreasing control voltages provided to the control terminal 718 (i.e., the control signals to the emitter degeneration element and collector loads move in opposite directions). In addition, the swapping arrangement and the existence of the gain dependence on the physical dimension (e.g., length and/or width) ratio of emitter degeneration element to collector load enables the emitter degeneration element and the collector load to have a substantially similar voltage at a differential control voltage of zero volts. Variations in supply voltage, ambient temperature, and/or manufacturing process thus cause the same percentage change among like components of the emitter degeneration element and the collector load. The "swapping" arrangement also assists in maintaining a constant gain among cascaded IF VGAs 650a and 650c. This topology overcomes the limitations of conventional systems, which swap or exchange the polarity between IF and BB VGA stages (e.g., the control voltage applied to an IF VGA emitter degeneration element and collector load is opposite in polarity to the control voltage applied to the BB VGA emitter degeneration element and collector load).

The gain of a VGA system comprising an IF VGA and/or a BB VGA is substantially constant despite changes in supply voltage, manufacturing process, and/or ambient temperature. The gain of the VGA system is determined by the physical dimension (e.g., length and/or width) ratio of the components comprising resistive loads present in the emitter degeneration element and collector load. That is, the gain is determined by a physical dimension ratio, and is not subject to variations in characteristics of different types of transistor devices (e.g., such as differences in VGS and threshold voltage between PMOS and NMOS degeneration and collector loads). Since the control voltages applied are polar opposites, a reference where the gain is determined corresponds to a differential control voltage of zero volts (since it is a differential signal applied to the input of terminals 910 and 912).

If the voltage applied to terminal 910 is equal to the voltage applied to terminal 912, then the differential input control voltage is zero. If the common mode voltages (ECMV and CCMV) are equal, then $V_{C1}$ is equal to $V_{C2}$. It is desired to maintain a similar gate-to-source voltage (and thus similar variable resistance) for the emitter degeneration element 708 (FIG. 8A) and the collector load 716 (FIG. 8A) within the IF VGA 650a at a zero volt differential input control voltage, such that the gain is a physical dimension ratio. In other words, at a differential input control voltage equal to zero volts, the gate to source voltage across transistors 861 (FIG. 8A) of the emitter degeneration element 708 is substantially equal to the gate-to-source voltage across transistors 849 (FIG. 8A) of the collector load 716 if the resistive devices are of a similar type. The resulting gain of the VGA at the differential input control voltage of zero is then a physical size ratio between these two resistive elements (i.e., the collector load 716 and the emitter degeneration element 708).

If ECMV is not equal to CCMV, then $V_{C1}$ and $V_{C2}$ are adjusted to compensate for the difference in value between ECMV and CCMV (assuming the voltage at terminal 910 equals the voltage at terminal 912). Increases of $V_{C1}$ are met by decreases in $V_{C2}$ within the same VGA, and vice versa.

Note that in other embodiments, a single-ended architecture (as opposed to a differential input architecture described above) can be employed. For example, a fixed reference voltage (e.g., a bandgap voltage that is independent of variations in manufacturing process, ambient temperature, and/or supply voltage) can be internally generated. A single-ended voltage provided by the DAC 538 (FIG. 5) can be compared to the bandgap voltage. If the single-ended voltage includes a range of 0-2V, the comparison can be made with a bandgap voltage of 1V. A single-ended voltage of 1V applied to control terminal 910 results in a differential voltage of zero when the 1V bandgap voltage is applied to control terminal 912, thus changing the single ended input from the DAC 538 to a differential input control voltage.

From control terminal 710, the control voltage is applied to IF VGA 650a, and to 650c via connection 924. The control voltage at control terminal 718 is applied to IF VGA 650a, and to 650c via connection 928. In other embodiments, a similar circuit to that shown in FIG. 9 can be used to generate control voltages for the second stage. A differential input is applied to differential input terminals 802 and 814 of the IF VGA 650a, which corresponds to the terminals of the same reference number for FIG. 8A. The IF VGA 650a provides a differential signal on connection 864a, 880a, which corresponds to like-numbered components shown in FIG. 8A with an "a" added to distinguish between the first stage output and the second stage outputs 864b, 880b. The differential signal on connection 864a, 880a is provided (through series capacitors not shown) to the differential input terminals 802b, 814b of the IF VGA 650c, resulting in a cascade arrangement depending on the gain desired. The IF VGA 650c provides a differential output signal on connections 864b, 880b, which can be supplied to a third IF VGA stage, or ultimately to a BB VGA in the manner similar to that described in FIG. 6. Note that IF VGA 650c can include the resistor-capacitor circuitry (e.g., 992, 994, 988) similar to that associated with the ECMV and CCMV in IF VGA 650a in some embodiments, for example when bias points vary between the IF VGA 650a and IF VGA 650c.

Figures 2A, 2B:
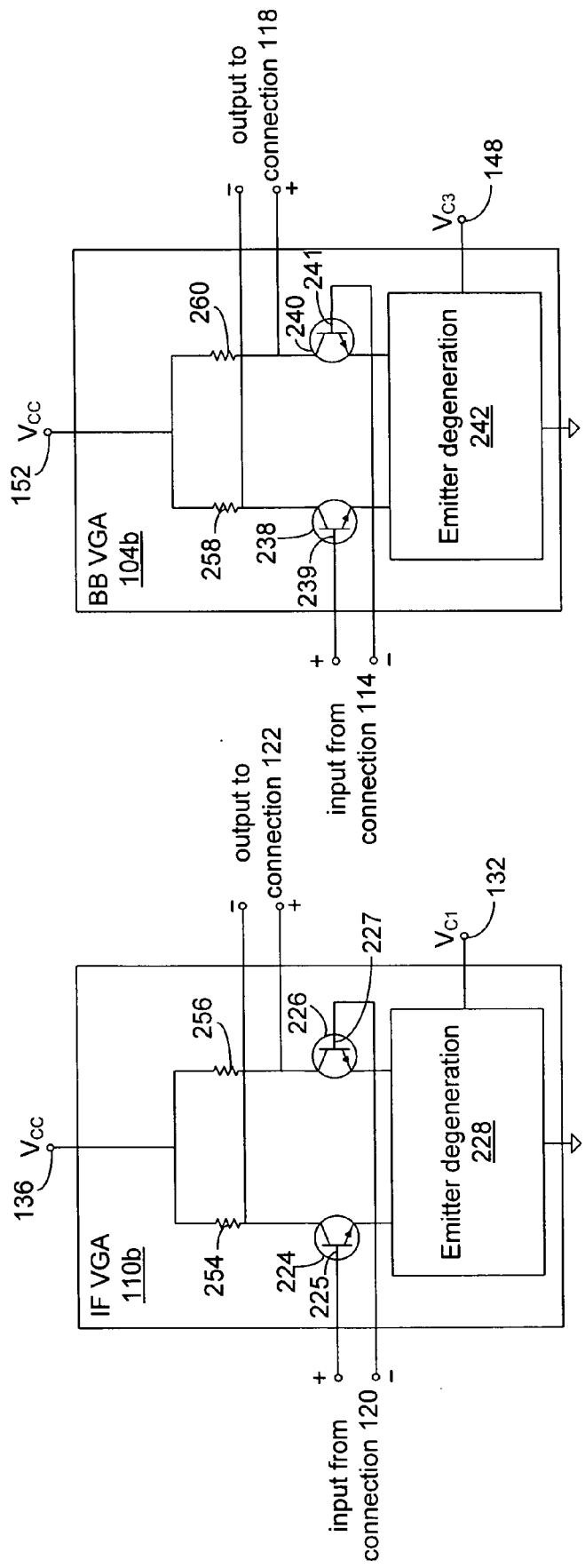
FIGS. 2A and 2B are combination schematic and block diagrams that illustrate another exemplar configuration for an IF VGA and a BB VGA.
Figure 3:
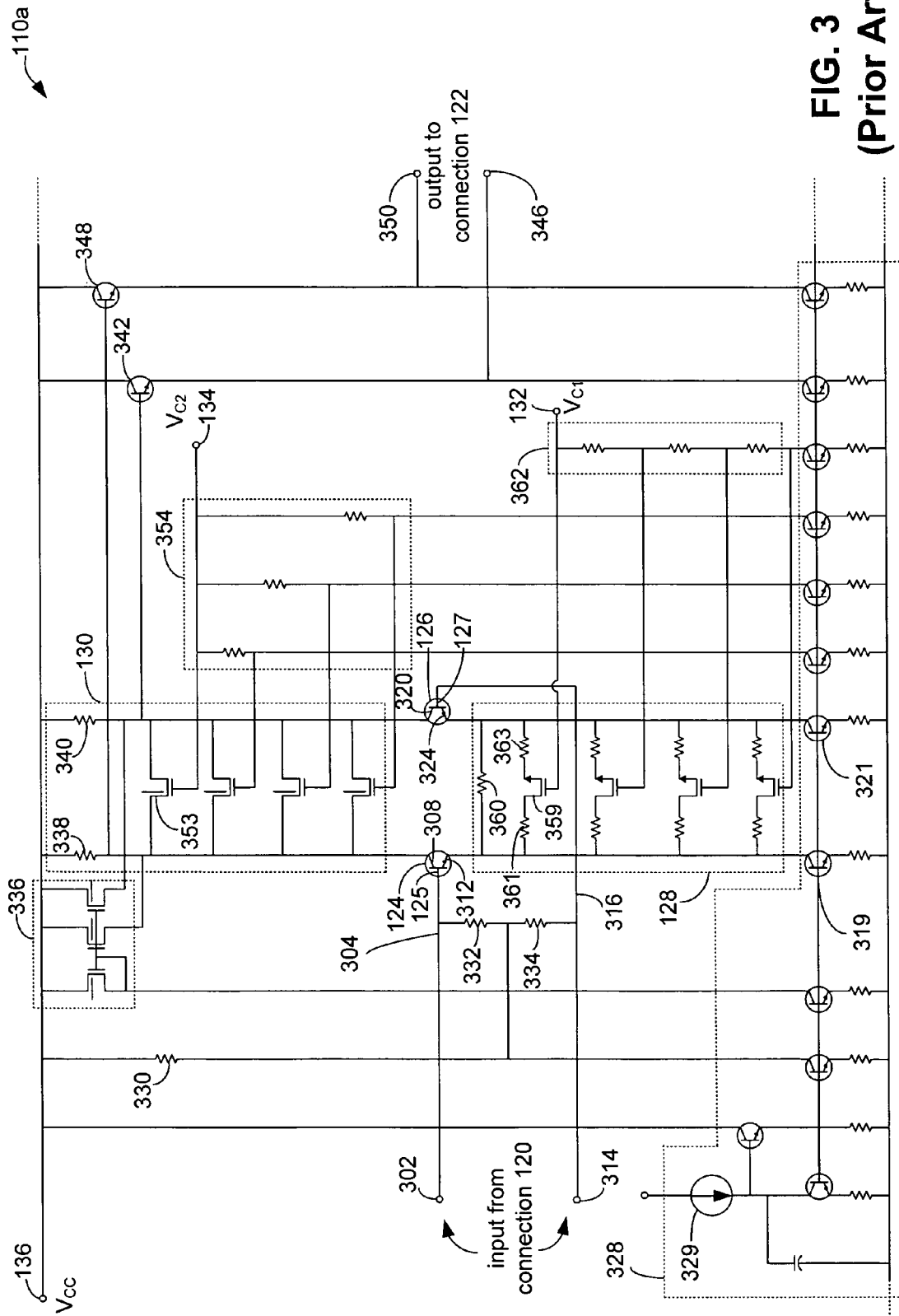
FIG. 3 is a schematic diagram illustrating a generalized variable gain amplifier (VGA) configured similarly to the IF VGA shown in FIG. 1B.
Figure 10B:
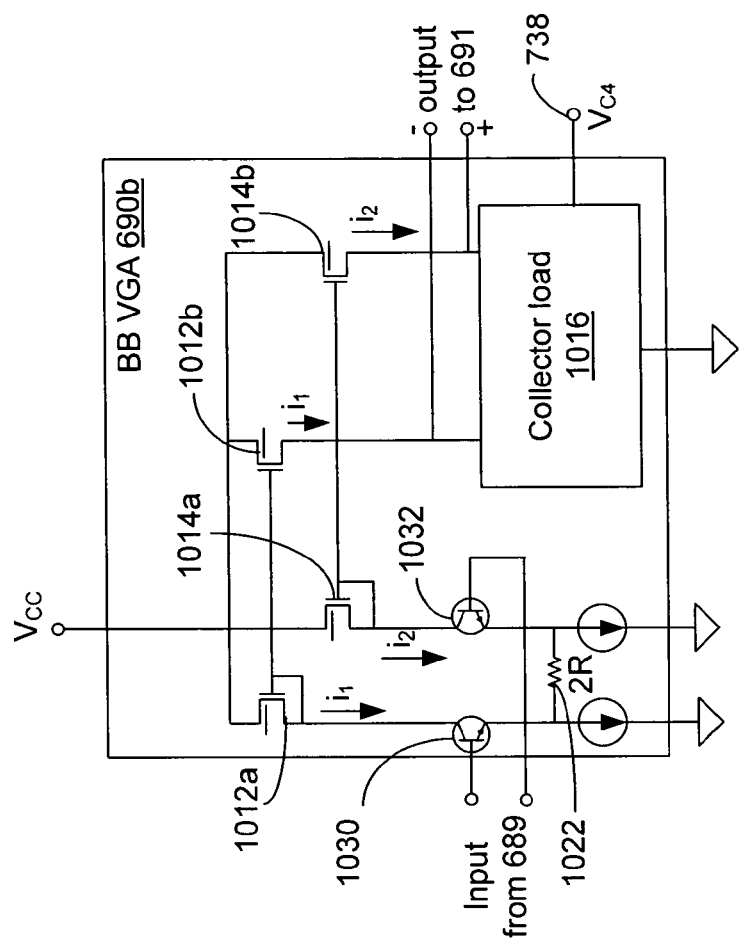
FIGS. 10A and 10B are combination schematic and block diagrams that illustrate an alternate embodiment for an IF VGA and a BB VGA for the transmitting section shown in FIG. 6.
Figure 10A:
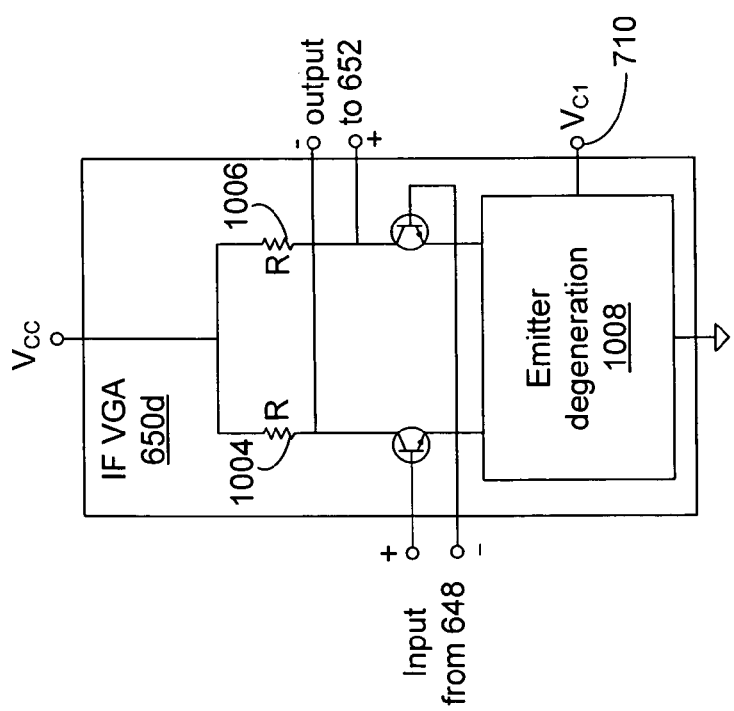

FIGS. 10A and 10B are block diagrams that illustrate an alternative embodiment for an IF VGA and a BB VGA for the transmitting section shown in FIG. 6. FIG. 10A shows an IF VGA 650d and FIG. 10B shows a BB VGA 690b. For this combination, one variable resistance element is used in a single VGA as opposed to two variable resistance elements. For example, IF VGA 650d includes emitter degeneration element 1008 and BB VGA 690b includes collector load 1016. This is in contrast to conventional systems, such as those shown in FIGS. 2A and 2B, which illustrate a combination wherein a single variable resistance is used at the emitter terminals of differential pair transistors for each VGA. The IF VGA 650d in FIG. 10A is configured with a constant collector load comprising resistors 1004 and 1006, each represented with a defined resistance value of "R", and an emitter degeneration element 1008 comprising a variable resistance (e.g., NMOS transistors) that is controlled by a control voltage $V_{C1}$ at control terminal 710.

The BB VGA 690b of FIG. 10B used in conjunction with the IF VGA 650d (FIG. 10A) is configured with a constant emitter degeneration element 1022 (of value 2R, wherein R is representative of a resistor having a defined resistance value, and 2R is representative of the resistance value of R multiplied by 2) and a collector load 1016 comprised of variable resistance of substantially similar type to that used for the emitter degeneration element 1008 (FIG. 10A) (e.g., NMOS transistors). Thus, the total collector resistance comprising the resistors 1004 and 1006 for the IF VGA 650d is equal to the total emitter resistance (2R) of the BB VGA 690b. The current $i_1$ of differential pair transistor 1030 is mirrored by a current mirror, comprising PMOS transistors 1012a and, 1012b, to the collector load 1016. Similarly, the current $i_2$ of differential pair transistor 1032 is mirrored by a current mirror, comprising PMOS transistors 1014a, 1014b, to the collector load 1016. The collector load 1016 is under the control of control voltage $V_{C4}$ provided at control terminal 738. $V_{C1}$ and $V_{C4}$ move in the same direction, similar to the control voltage operation shown in FIGS. 7A and 7B.

The emitter degeneration element 1008 of the IF VGA 650d is similar in type to the collector load 1016 of the BB VGA 690b, providing for a gain response of each VGA that changes similarly in amount to each other, but in opposite direction, thus enabling a total gain that is constant. The gain for each VGA (i.e., IF VGA 650d and BB VGA 690b), as is true of the embodiments shown in FIGS. 7A-8B, is determined by the physical dimensional ratios of the emitter degeneration element and the collector load when the control voltages are substantially identical.

Figure 11A:
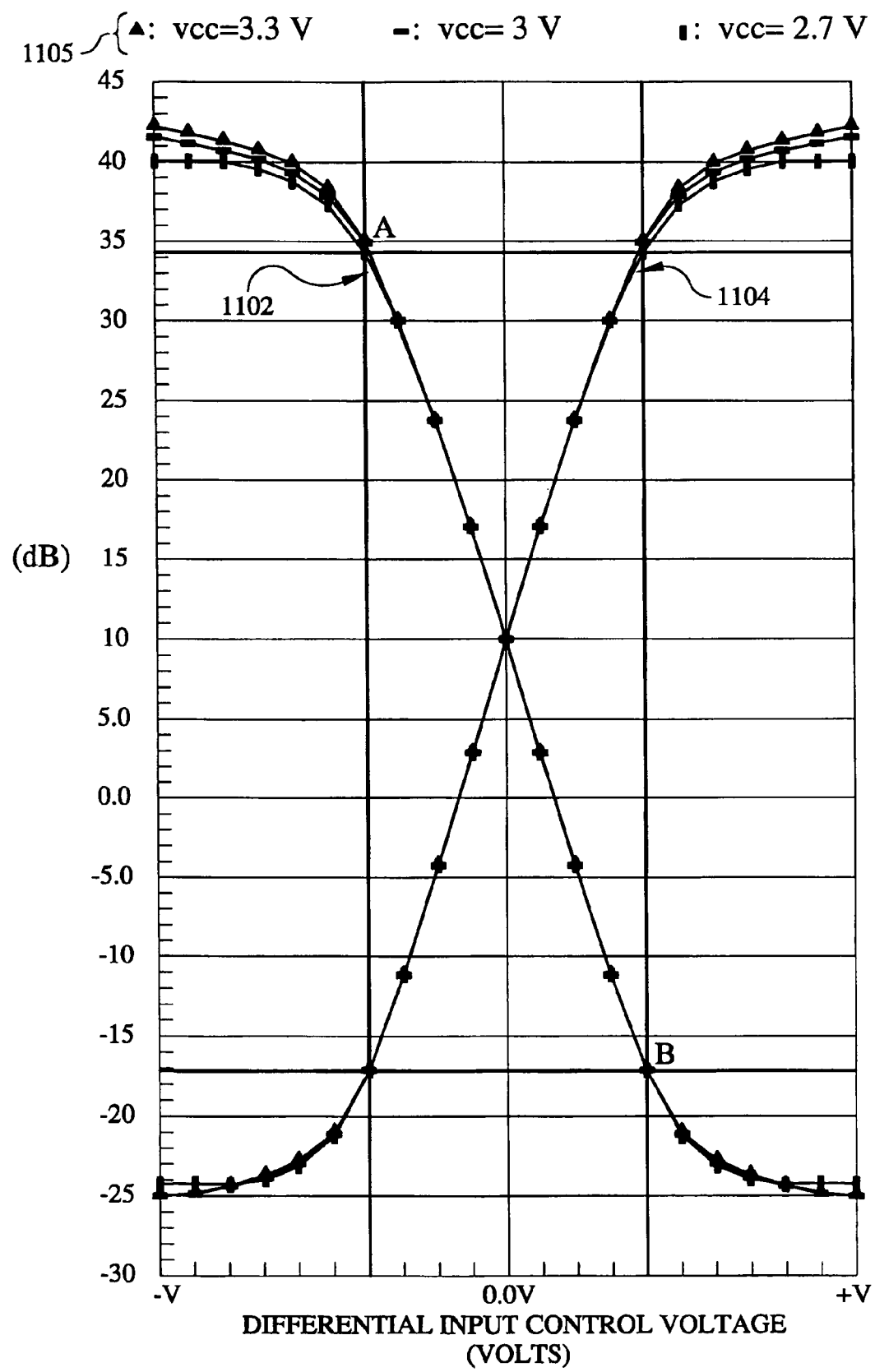
FIG. 11A is a graphical illustration showing the relationship between variations in supply voltage and gain as a function of differential input control voltage for a VGA system comprising an IF VGA and a BB VGA.
Figure 11B:
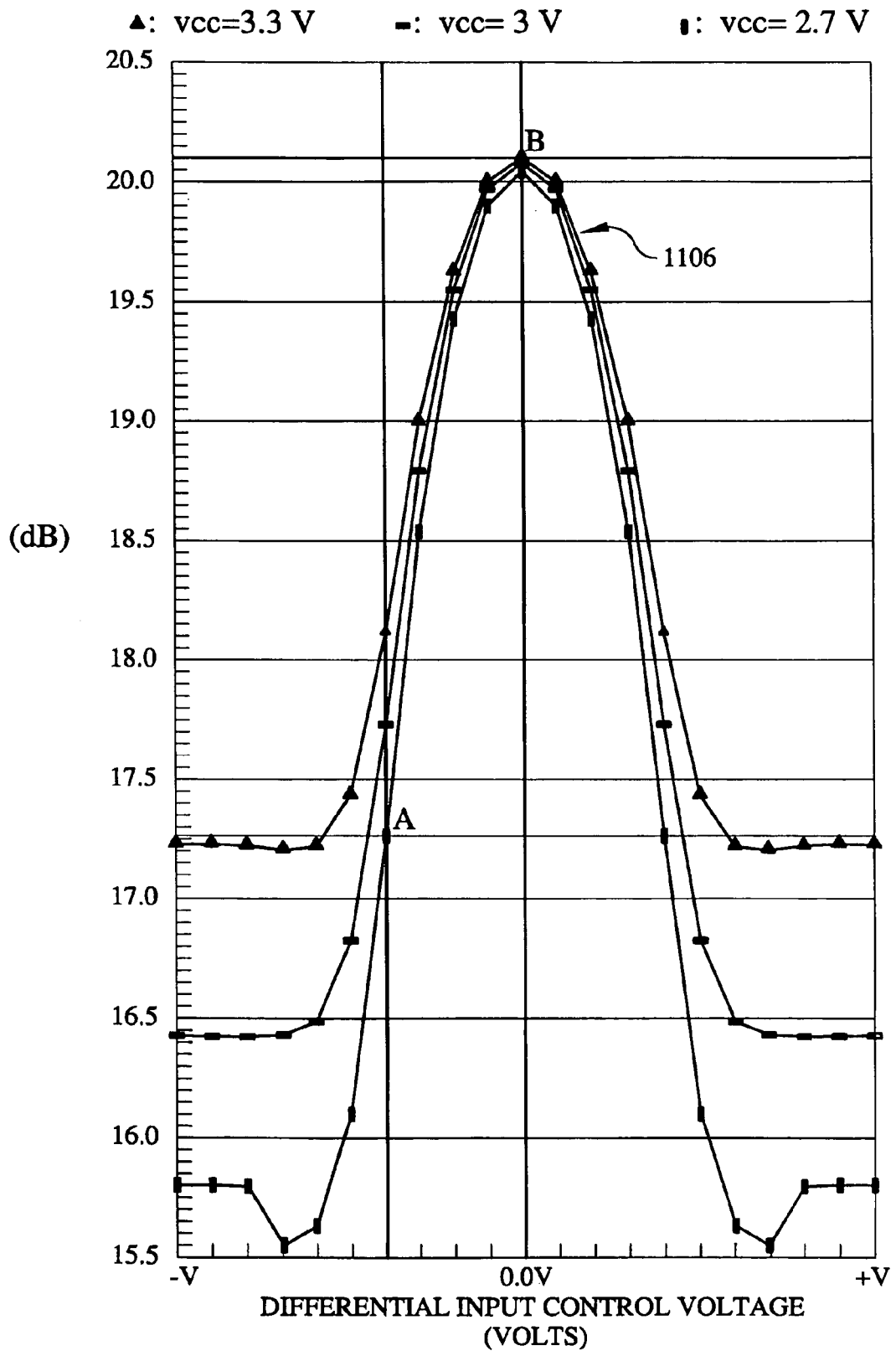
FIG. 11B is a graphical illustration showing the relationship between variations in supply voltage and gain for the VGA system associated with FIG. 11A as a function of differential input control voltage.

FIGS. 11A and 11B are graphical illustrations highlighting performance features of IF VGAs and BB VGAs configured similarly to the embodiments described in FIGS. 8A or 8B. Note that the graphs shown in FIGS. 11A and 11B convey similar information as those graphs shown in FIGS. 4A and 4B, except for differences in performance characteristics and larger steps in voltage (e.g., 2.7V, 3.0V, and 3.3V versus 0.1V increments in FIGS. 4A and 4B).

FIG. 11A shows the relationship between differential input control voltage and gain (dB) for a range of different supply voltages. As shown, the IF VGA curves 1102 comprise three substantially coincident (as opposed to visually distinguishable) curves reflecting three different supply voltage levels (3.3V, 3.0V, and 2.7V, as shown by symbols in symbol ledger 1105) that reflect a decreasing gain with increasing differential input control voltage. In particular, in the linear range of interest demarcated between points A and B, there is little noticeable variation in gain with changes in supply voltage. The extremes of the IF VGA curves 1102 reveal some variation, as would be expected due to the variations in supply voltage and the inherent nature of a resistive load having transistor devices at these extremes.

The BB VGA curves 1104 also comprise coincident curves reflecting the relationship between differential input control voltage and gain (dB) for a range of different supply voltages, and are essentially a mirror image of the IF VGA curves 1102.

Figure 4B:
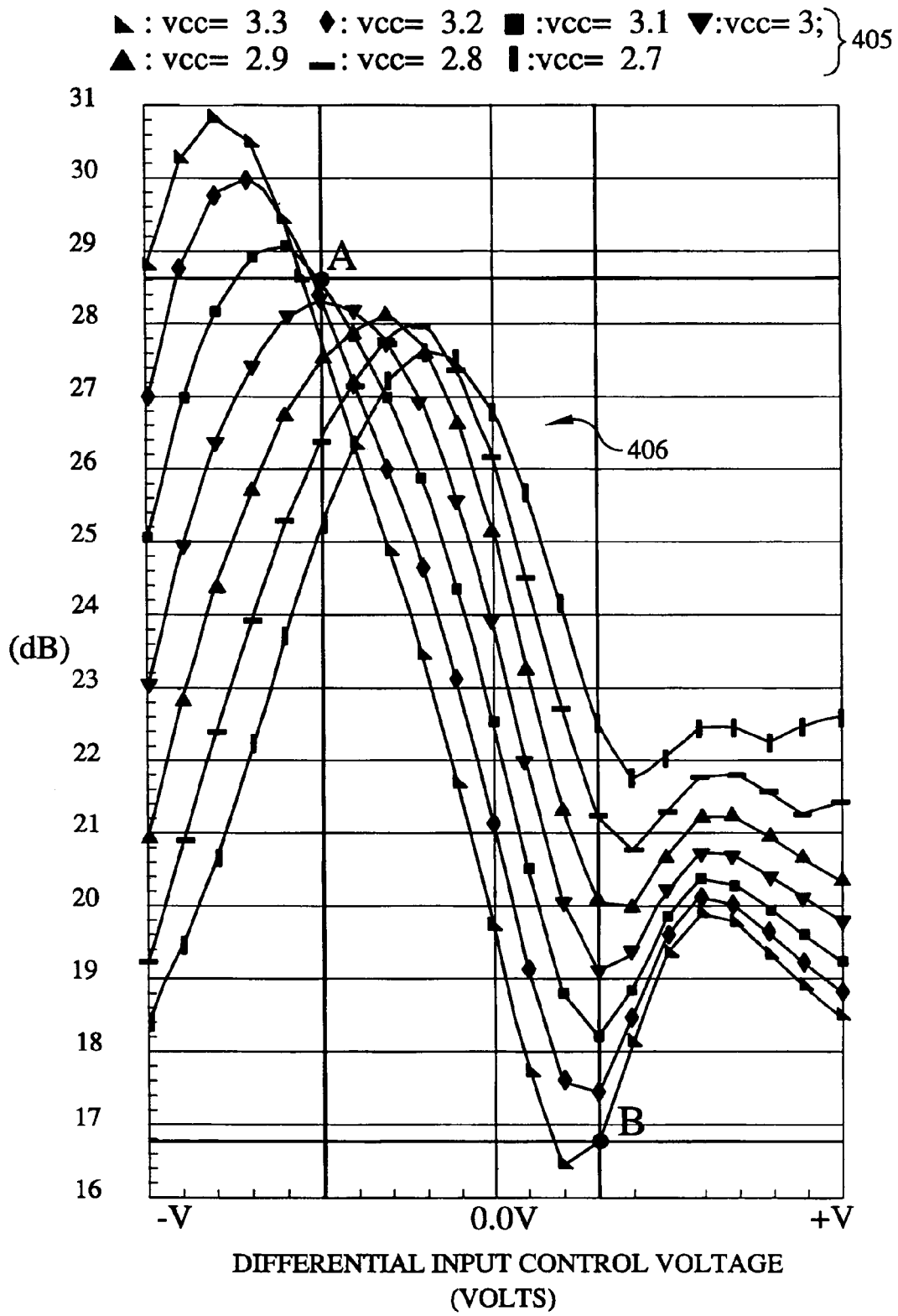
FIG. 4B is a graphical illustration showing the relationship between variations in supply voltage and gain for the combined VGA system associated with FIG. 4A as a function of differential input control voltage.

The slopes of the IF VGA and BB VGA curves 1102 and 1104 are essentially the same, with a similar range (e.g., −25 to 40 dB). Thus changes in voltage supply, manufacturing process, and/or ambient temperature are equally apportioned between the IF VGA and the BB VGA. Notably, there is little shift in the curves (e.g., curves for three voltage variations appear to substantially coincide, versus the visually distinguishable curves corresponding to these different voltages in FIGS. 4A and 4B), which is evidence of a substantially constant gain despite changes in voltage supply. As also noted in FIG. 11B, the summation of the individual IF and BB VGA gains is less than the total gain shown in FIG. 4B, which is a result of substantially constant gain among the supply voltage variations. For example, the gain variation of the embodiments described in FIGS. 8A or 8B is approximately less than ±2.7 dB, versus ±6 dB for conventional systems (FIG. 4B).

Further note the symmetry of the IF and BB VGA curves 1102 and 1104 with respect to a differential input control voltage of zero volts. In other words, the individual IF and BB VGA curves 1102 and 1104 go through a zero differential input control voltage despite the variations in ambient temperature, manufacturing process, and/or voltage supply, and thus when the control voltages are swapped, a constant gain is effected. This result is enabled in part by the fact that the gain of each VGA stage is formulated from a ratio of physical dimensions (e.g., length and/or width) at emitter degeneration element and collector loads at a differential input control voltage of zero volts. For example, a collector load having a physical length three times longer than the emitter degeneration element would result in a gain of "3" despite changes in voltage supply, ambient temperature, and/or manufacturing process. In other words, changes in voltage supply, ambient temperature, and/or manufacturing process would substantially equally effect components on the collector and emitter side.

Further, the emitter degeneration element and the collector loads have the same voltage value at a control voltage equal to zero. That is, the magnitude of the voltage at the control terminal 710 (FIG. 8A) is equal in magnitude to the voltage at the control terminal 718 (FIG. 8A) at a differential input control voltage of zero volts. For example, if a voltage of zero volts is applied to difference amplifier 914 (FIG. 9) and difference amplifier 916 (FIG. 9), and the resulting control voltage, $V_{C1}$, present at the control terminal 710 is at 2.0V, then the resulting control voltage, $V_{C2}$, at the control terminal 718 is also at 2.0V. The structure of the embodiments described in FIGS. 8A or 8B thus substantially obviate dependency on three terminal device characteristics, which have performance differences that are further exacerbated by differences in changes in voltage supply, manufacturing process, and/or ambient temperature.

Figure 12A:
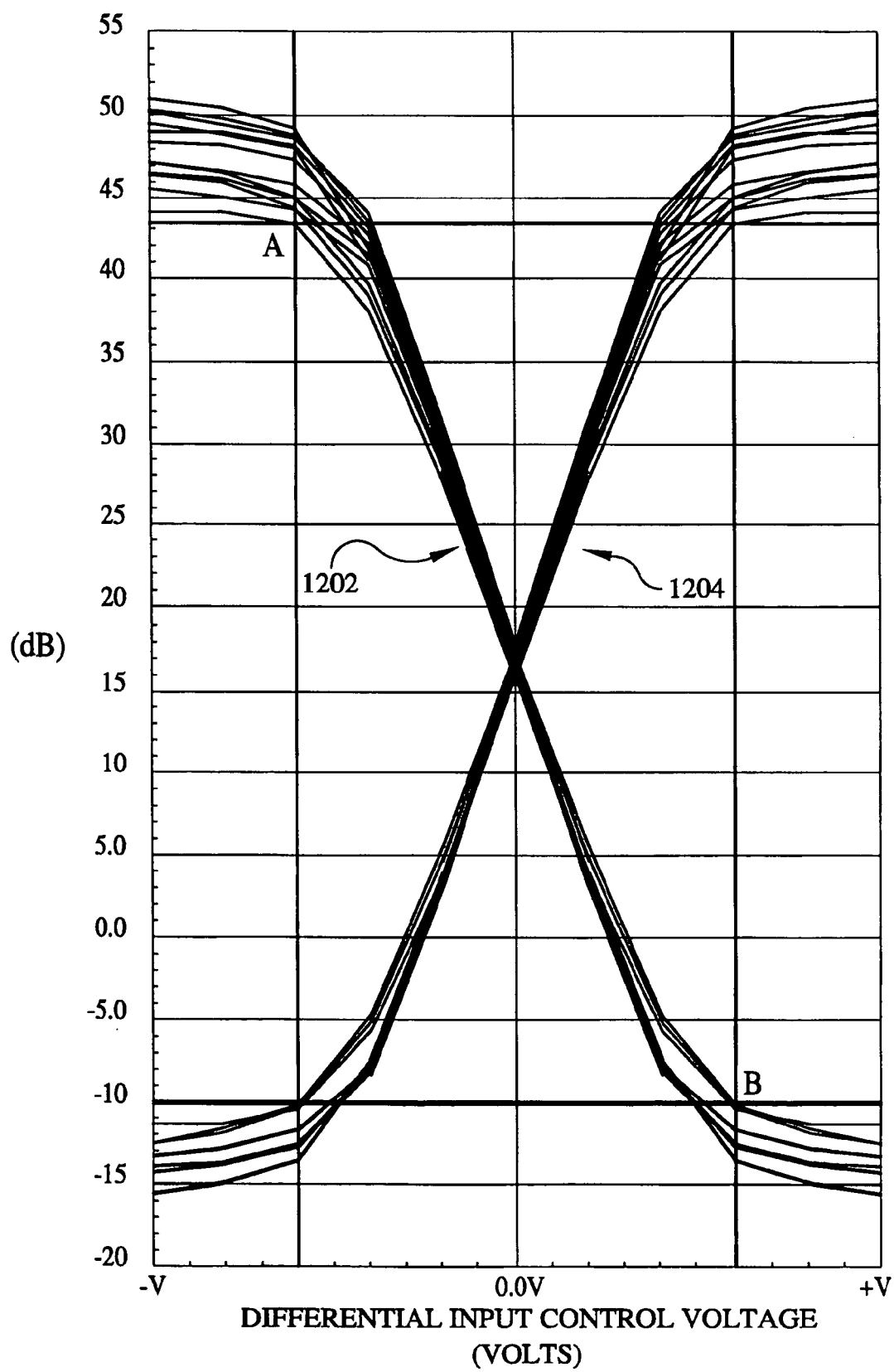
FIGS. 12A-12B are graphical illustrations showing the relationship between variations in manufacturing process and ambient temperature in addition to variations in supply voltage for another example VGA system comprising an IF VGA and a BB VGA.
Figure 12B:
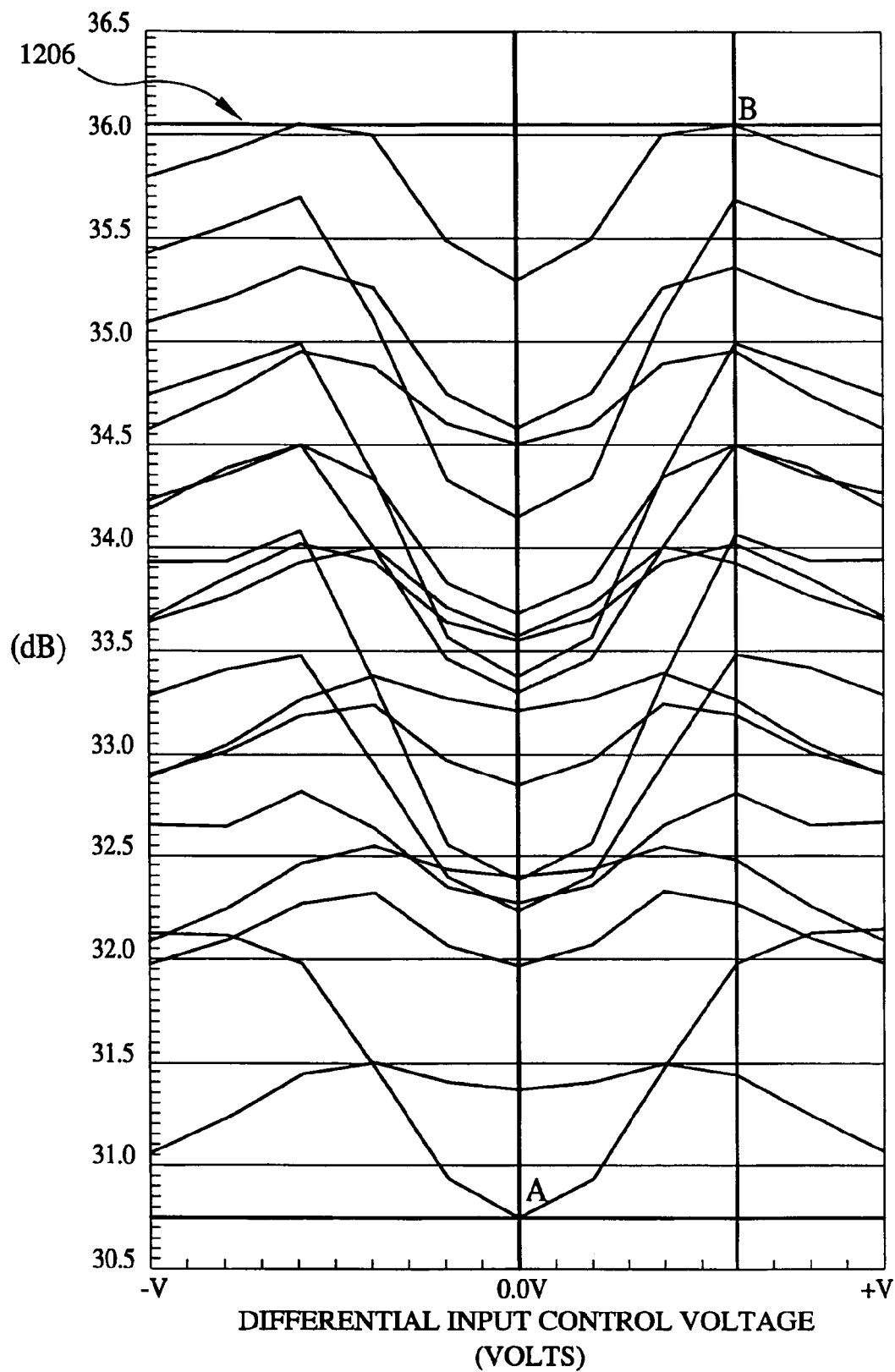

FIGS. 12A and 12B show another example for IF and BB VGA curves when there are variations in manufacturing process and ambient temperature, in addition to changes in supply voltage. Changes in supply voltage occur in 0.3 V increments between 2.7V-3.3V, and process variations are reflected for nominal, fast, and slow process, and three temperatures: −20 C., 27 C., and 80 C. For example, as understood to those skilled in the art, if process variations are nominal, then the components operate as specified. If the process is designated as fast, components such as resistors or capacitors are smaller than specified and gains for transistors are larger. For slow process, resistors and capacitors are larger than specified, and gains are smaller than specification. For FIG. 12A, curves 1202 show variations in gain for an IF VGA, similarly structured to the IF VGA 650a (FIG. 8A). Curves 1204 show variations in gain for a BB VGA, similarly structured to the IF VGA 650a. Each distinct curve of curves 1202 correspond to different conditions of manufacturing process variations, ambient temperature, and/or supply voltage. Symmetrical curves for the corresponding conditions are shown in curves 1204. Thus, variations in a combination of these conditions effect the gain of the IF VGA and the BB VGA in a similar manner.

FIG. 12B includes curves 1206, which shows the total gain change for each condition. For example, the top curve in FIG. 12B reveals a relatively small gain variation (approximately 0.6 dB) for the IF VGA in combination with the BB VGA. Points A and B represent the lowest and highest gain variation, respectively, reflecting a well-controlled gain variation.

While various embodiments of the invention have been described, it will be apparent to those of ordinary skill in the art that many more embodiments and implementations are possible that are within the scope of this invention. Accordingly, the invention is not to be restricted except in light of the following claims and their equivalents.

What is claimed is:

1. A method of providing direct current (DC) gain control voltages that operate in opposing manner, the method comprising:
   receiving at a first difference amplifier coupled to a variable gain amplifier:
      a first reference voltage, the first reference voltage corresponding to a summation of a DC shifted voltage and an emitter common mode voltage (ECMV), the ECMV derived from the variable gain amplifier;
      a first control terminal voltage; and
      a second control terminal voltage, the first and second control terminal voltage derived from a differential control voltage;
   receiving at a second difference amplifier coupled to the variable gain amplifier a second reference voltage, the first control terminal voltage, and the second control terminal voltage, the second reference voltage corresponding to a summation of a DC shifted voltage and a collector common mode voltage (CCMV), the CCMV derived from the variable gain amplifier;
   at the first difference amplifier, adding the first reference voltage to the second control terminal voltage to provide a first sum, and subtracting from the first sum the first control terminal voltage to provide a first DC gain control voltage;
   at the second difference amplifier, adding the second reference voltage to the first control terminal voltage to provide a second sum, and subtracting from the second sum the second control terminal voltage to provide a second DC gain control voltage that operates in opposing manner to the first DC gain control voltage; and
   providing the first DC gain control voltage and the second DC gain control voltage to the variable gain amplifier.

2. The method of claim 1, further comprising deriving the ECMV and CCMV by subjecting differential emitter and collector voltages of the variable gain amplifier through a respective RC network, wherein subjecting comprises averaging the differential emitter and collector voltages at resistors and capacitors corresponding to the respective RC network.

3. The method of claim 1, further comprising receiving the DC shifted voltage at respective summers by receiving a voltage value that is at least equal to a threshold voltage of a transistor-type used in a degeneration element and a collector load of the variable gain amplifier upon which the first DC gain control voltage and the second DC gain control voltage is respectively provided.

4. The method of claim 3, wherein the degeneration element comprises an N-channel metal oxide field-effect (NMOS) transistor.

5. The method of claim 3, wherein the collector load comprises a P-channel metal oxide field-effect (PMOS) transistor.

6. The method of claim 1, wherein the variable gain amplifier is embodied as a baseband variable gain amplifier.

7. The method of claim 1, wherein the variable gain amplifier is embodied as an intermediate frequency variable gain amplifier.

8. The method of claim 1, further comprising providing a third DC gain control voltage and a fourth DC gain control voltage to a second variable gain amplifier, the fourth DC gain control voltage acting in opposing manner to the third DC gain control voltage, the variable gain amplifier coupled to the second variable gain amplifier.

9. The method of claim 1, further comprising providing a third DC gain control voltage and a fourth DC gain control voltage to a second variable gain amplifier, the fourth DC gain control voltage acting in opposing manner to the third DC gain control voltage, wherein the first DC gain control voltage and the fourth DC gain control voltage operate in like manner and the second DC gain control voltage and the third DC gain control voltage operate in like manner, the variable gain amplifier coupled to the second variable gain amplifier.

10. The method of claim 1, further comprising receiving the differential control voltage from a device of a transceiver baseband subsystem.

11. A system for providing direct current (DC) gain control voltages that operate in opposing manner, the system comprising:
    a variable gain amplifier;
    a first difference amplifier coupled to the variable gain amplifier, the first difference amplifier having three inputs configured to receive a first reference voltage, a first control terminal voltage, and a second control terminal voltage, respectively, the first reference voltage corresponding to a summation of a DC shifted voltage and an emitter common mode voltage (ECMV), the ECMV derived from the variable gain amplifier, the first and second control terminal voltage derived from a differential control voltage, wherein the first difference amplifier is configured to add the first reference voltage to the second control terminal voltage to provide a first sum, and subtract from the first sum the first control terminal voltage to provide a first DC gain control voltage to the variable gain amplifier; and
    a second difference amplifier coupled to the variable gain amplifier, the second difference amplifier having three inputs configured to receive a second reference voltage, the first control terminal voltage, and the second control terminal voltage, the second reference voltage corresponding to a summation of a DC shifted voltage and a collector common mode voltage (CCMV), the CCMV derived from the variable gain amplifier, wherein the second difference amplifier is configured to add the second reference voltage to the first control terminal voltage to provide a second sum, and subtract from the second sum the second control terminal voltage to provide a second DC gain control voltage that operates in opposing manner to the first DC gain control voltage, the second DC gain control voltage provided to the variable gain amplifier.

12. The system of claim 11, further comprising respective RC networks from which the ECMV and CCMV are derived, wherein the respective RC network is configured to average the received differential emitter and collector voltages.

13. The system of claim 11, further comprising respective summers configured to receive the DC shifted voltage, the DC shifted voltage corresponding to a voltage value that is at least equal to a threshold voltage of a transistor-type used in a degeneration element and a collector load of the variable gain amplifier upon which the first DC gain control voltage and the second DC gain control voltage is respectively provided.

14. The system of claim 13, wherein the degeneration element comprises an N-channel metal oxide field-effect (NMOS) transistor.

15. The system of claim 13, wherein the collector load comprises a P-channel metal oxide field-effect (PMOS) transistor.

16. The system of claim 11, wherein the variable gain amplifier is embodied as a baseband variable gain amplifier.

17. The system of claim 11, wherein the variable gain amplifier is embodied as an intermediate frequency variable gain amplifier.

18. The system of claim 11, further comprising a second variable gain amplifier configured to receive a third DC gain control voltage and a fourth DC gain control voltage, the fourth DC gain control voltage acting in opposing manner to the third DC gain control voltage, the variable gain amplifier coupled to the second variable gain amplifier.

19. The system of claim 11, further comprising a second variable gain amplifier configured to receive a third DC gain control voltage and a fourth DC gain control voltage, the fourth DC gain control voltage acting in opposing manner to the third DC gain control voltage, wherein the first DC gain control voltage and the fourth DC gain control voltage operate in like manner and the second DC gain control voltage and the third DC gain control voltage operate in like manner, the variable gain amplifier coupled to the second variable gain amplifier.

20. The system of claim 11, further comprising a device configured to provide the differential control voltage from a transceiver baseband subsystem.

* * * * *